United States Patent [19]
Sexton

[11] Patent Number: 6,107,577
[45] Date of Patent: *Aug. 22, 2000

[54] FLAT SURFACE-MOUNTED MULTI-PURPOSE WIRE

[76] Inventor: Robert Jay Sexton, 20506 Comfort Ct., Ashburn, Va. 20147

[*] Notice: This patent is subject to a terminal disclaimer.

[21] Appl. No.: 08/985,079

[22] Filed: Dec. 4, 1997

Related U.S. Application Data

[63] Continuation-in-part of application No. 08/942,305, Oct. 1, 1997, which is a continuation of application No. 08/775,941, Jan. 3, 1997, Pat. No. 5,804,768, which is a continuation of application No. 08/465,466, Jun. 5, 1995, abandoned.

[51] Int. Cl.[7] ...................................................... H01B 7/08
[52] U.S. Cl. ........................... 174/117 F; 174/117 FF; 174/117 A; 385/101
[58] Field of Search .................... 174/117 F, 117 FF, 174/117 A, 117 R; 156/51; 385/101, 114

[56] References Cited

U.S. PATENT DOCUMENTS

| | | | |
|---|---|---|---|
| 2,200,776 | 5/1940 | Hoover | 174/117 F |
| 3,168,617 | 2/1965 | Richter | 174/117 F |
| 4,185,887 | 1/1980 | Ferrentino | 385/114 |
| 4,196,032 | 4/1980 | Eggleston | 385/114 X |
| 4,355,865 | 10/1982 | Conrad et al. | 385/114 |
| 4,401,361 | 8/1983 | Slaughter | 385/114 |
| 4,404,425 | 9/1983 | Rich | 174/117 F X |
| 5,500,489 | 3/1996 | Shah et al. | 174/117 FF |
| 5,673,352 | 9/1997 | Bauer et al. | 385/114 |
| 5,804,768 | 9/1998 | Sexton | 174/117 F |

*Primary Examiner*—Kristine Kincaid
*Assistant Examiner*—Chau N. Nguyen
*Attorney, Agent, or Firm*—Jones Volentine, LLP

[57] ABSTRACT

A flat, surface mounted, flexible, multi-purpose wire has a plurality of flat elongated conductors spaced apart in a generally parallel relationship. Each of the flat conductors includes a plurality of conductive layers. At least one optical fiber lies lengthwise in a plane between the flat conductors. An adhesive material separates the flat conductors and an insulation layer surrounds the flat conductors and the adhesive material, with the adhesive material bonding to the insulation layer. A cross-sectional height of the flat conductors and insulation layer is such that the multi-purpose wire will blend in with the surface when painted or after wallpaper is applied.

18 Claims, 26 Drawing Sheets

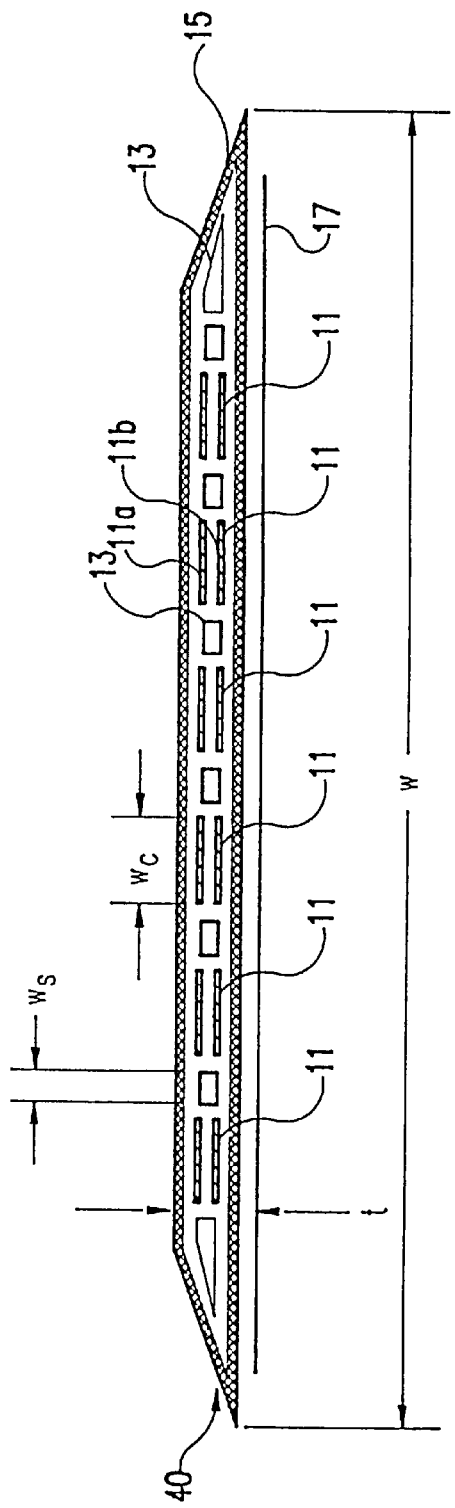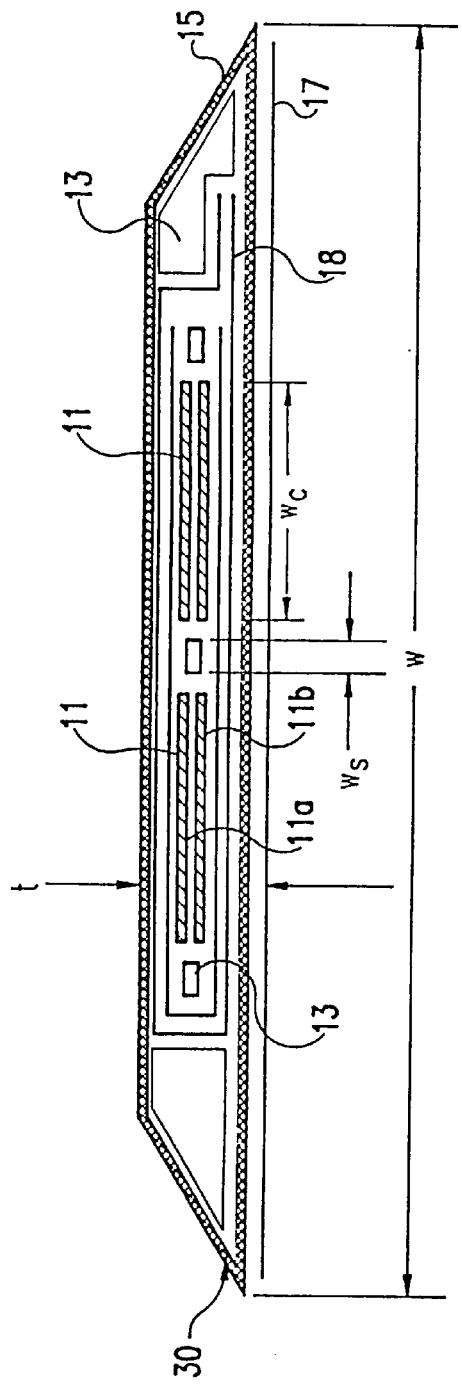
FIG.4
FIG.3

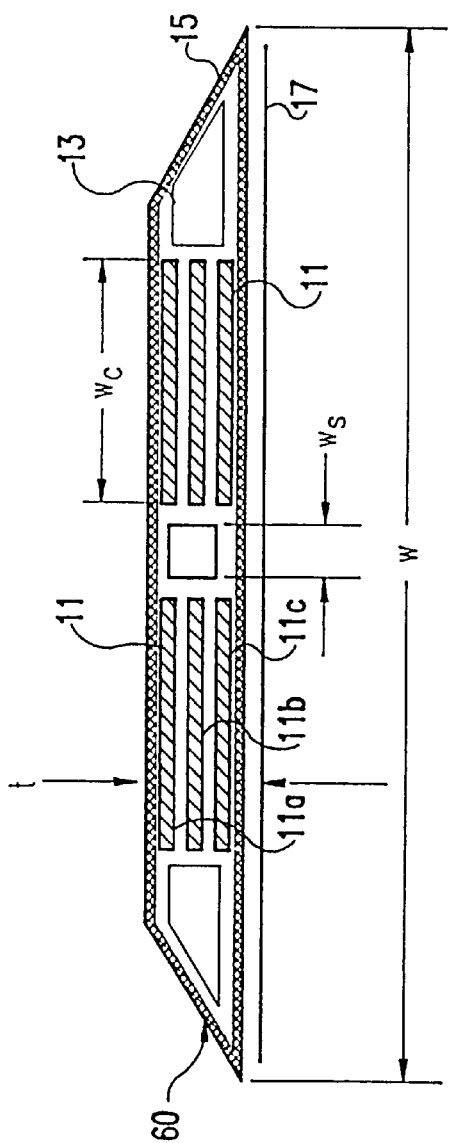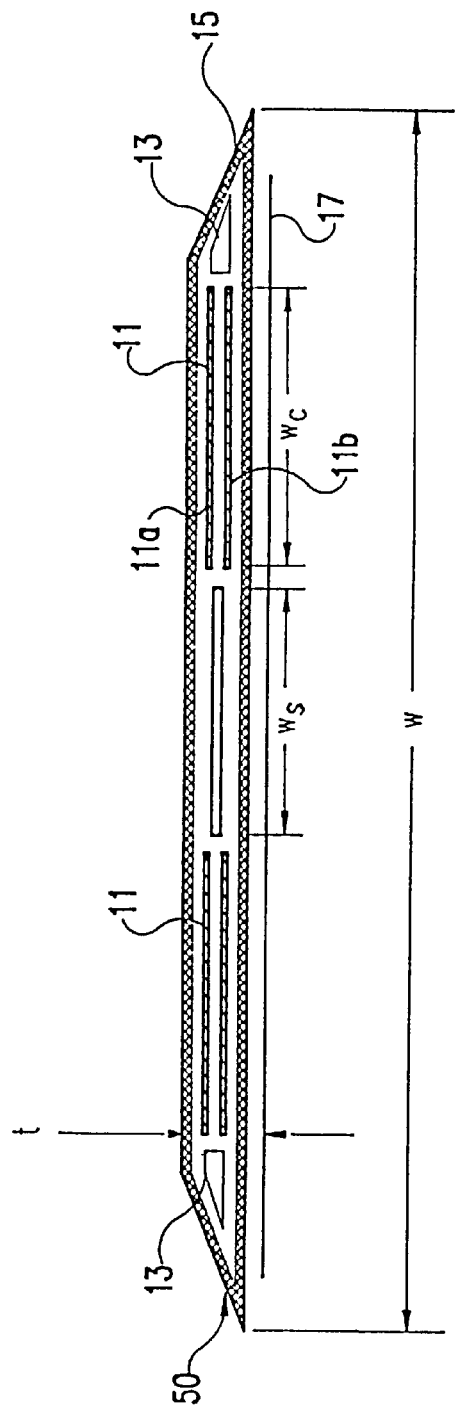

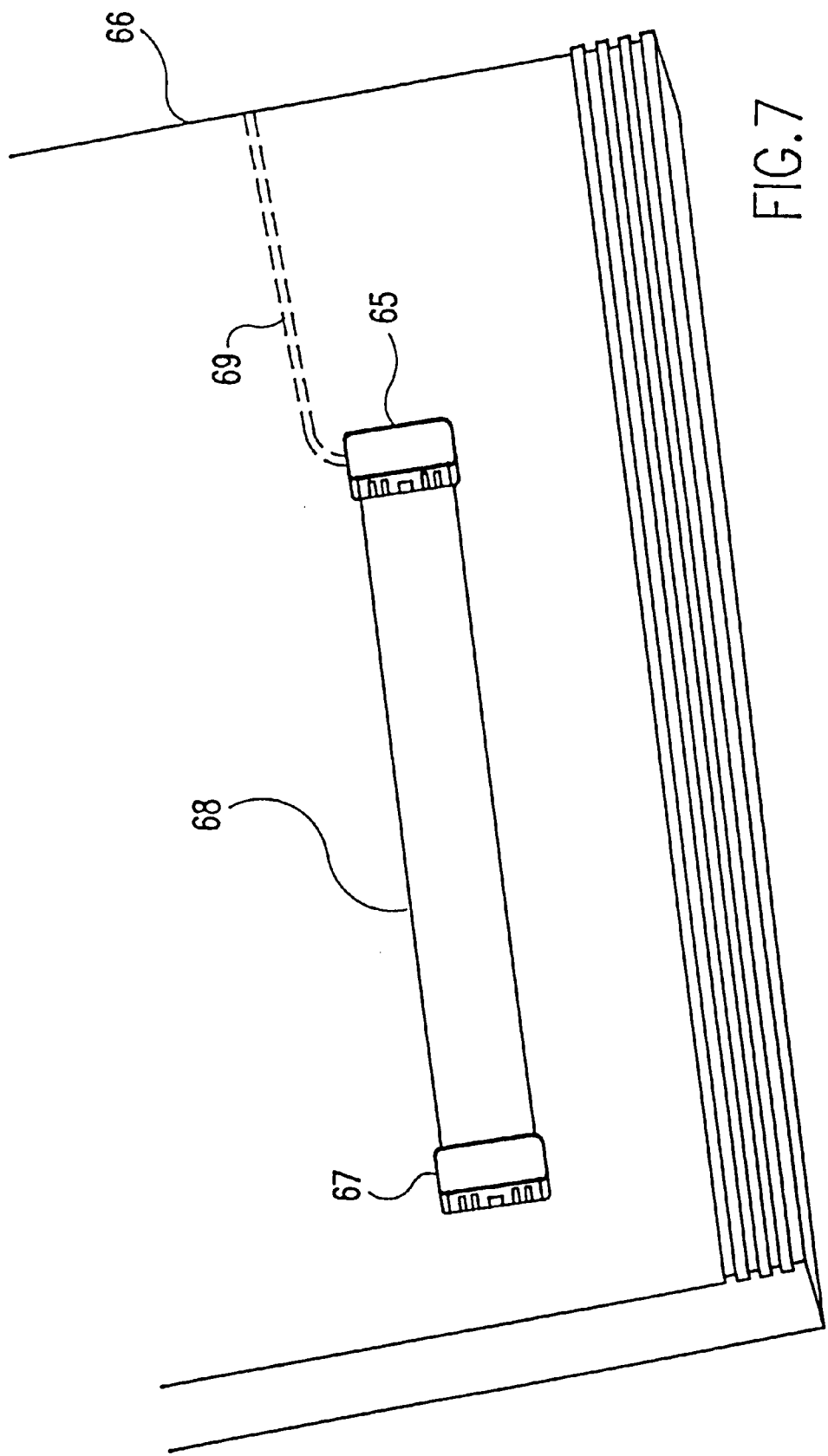

FLAT SURFACE-MOUNTED MULTI-PURPOSE WIRE

This is a Continuation-In-Part application of Ser. No. 08/942,305, filed Oct. 1, 1997, entitled "FLAT SURFACE-MOUNTED MULTI-PURPOSE WIRE", Atty. Docket No. DECORP.004), which is a Continuation application of Ser. No. 08/775,941 filed Jan. 3, 1997 now U.S. Pat. No. 5,804,768, which is a Continuation application of Ser. No. 08/465,466 filed Jun. 5, 1995, now abandoned.

BACKGROUND OF THE INVENTION

1. Field of the Invention

The present invention generally relates to flat wiring, and more particularly, to a thin, bendable, surface-mounted flat wire for use in a variety of wiring applications.

2. Description of the Related Art

Current wiring and re-wiring techniques and procedures present many limitations to the user in existing commercial or residential applications. The choices for adding, changing or moving any of the many wiring applications—electrical, telephone, antenna/CATV, loud speaker, and low voltage wiring, as well as the associated plugs, switches, and connections—is expensive or obtrusive or both.

Temporary or removable methods such as extension cords, long telephone and antenna/CATV cords, external loud speaker wire, and low voltage wire, are cumbersome and hard to hide or blend into a room.

Permanent installations typically require either a professional to install in a wall if the user desires a hidden installation or the use of some type of unattractive and inflexible conduit. Both methods tend to be expensive.

In light of the foregoing, there exists a need for a permanent, non-obtrusive, low-cost, easy to self-install, location specific, hidden system for wiring and re-wiring applications on walls and ceilings. There also exists a need for associated plugs, switches, and connections that could provide an interface between such a new wiring system and conventional wiring.

SUMMARY OF THE INVENTION

The present invention is directed to flat, thin, flexible, multi-layered wires, which substantially obviate one or more of the problems due to the limitations and disadvantages of the related art.

By way of example and not by limitation, the present invention can be utilized in a wide variety of applications, including: standard electrical wiring; telephone wiring; loud speaker wiring; low voltage wiring such as security systems; under surface lighting; and cable TV wiring.

In addition, the present invention includes several unique outlets, switches, and connectors that provide the interface between existing conventional round wiring and the flat wires of the present invention.

To achieve these and other advantages and in accordance with the purpose of the invention, as embodied and broadly described, the invention provides for a surface mounted, flexible, multi-purpose wire, comprising, a plurality of flat elongated conductors spaced apart in a generally parallel relationship, wherein each of the plurality of flat conductors comprises a plurality of copper layers; an adhesive material separating the plurality of flat conductors; and an insulation layer surrounding the flat conductors and the adhesive material, wherein the adhesive material bonds to the insulation layer; and wherein a cross-sectional height of the flat conductors and insulation layer is such that the multi-purpose wire will blend in with the surface when painted or after wallpaper is applied.

The copper layers are generally on the order of about 0.002 inches thick, but may range from about 0.0004 to 0.020 inches. The number and thickness of the copper layers may be adjusted to suit the desired application. It is understood that the various dimensions described herein may vary considerably within the practice of this invention.

While copper is the preferred conductor, other conductive materials, such as aluminum, gold, silver, zinc or alloys thereof, may be used with the present invention. While any conductive material may be utilized, the cost of a particular conductive material and its relative conductivity will dictate whether the material is a commercially viable option.

The width or thickness of the conductors will vary somewhat when materials other than copper are employed. When using materials other than copper, it is preferable to maintain the same conductor thickness for the same current rating so that the cross-sectional area of the flat-wire is kept to a minimum. Accordingly, for those conductive materials having a lower conductivity than copper, the conductive layers would be wider, and for those conductive materials having a higher conductivity than copper, the conductive layers would be narrower.

In addition, the present invention may incorporate optical fibers spaced adjacent to the conductors. Preferably, the optical fibers would be located in close proximity to the conductors to provide rigidity and support. Also, it is preferable that the optical fiber be located outside the area of the adhesive material so that the optical fiber may have some freedom of movement.

The insulation layer can be composed of materials selected form the group consisting of polyester films (e.g., Dupont Mylar), urethane films, or teflon films. The adhesive material can be selected from the group consisting of adhesive tape (e.g., 3M 9500PC), liquid adhesive, or a combination of the two.

In another aspect, the invention provides for a surface mounted, flexible, multi-purpose wire, comprising a single flat conductor together with the adhesive material and insulation layers as described above.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is an exploded side cross-sectional view of a 2-wire flat conductor for use in loud speaker systems;

FIG. 4 is an exploded side cross-sectional view of a 6-wire flat conductor for use in telephone applications;

FIG. 5 is an exploded side cross-sectional view of a 2-wire flat conductor for CATV applications;

FIG. 6 is an exploded side cross-sectional view of a 2-wire flat conductor for use in low voltage applications;

FIG. 7 is a perspective configuration view of the pluggable and stand-alone outlets connected via a flat wire;

DETAILED DESCRIPTION OF EMBODIMENTS OF THE INVENTION

In general, as stated above, the present invention can be used or be adapted to perform in a wide variety of applications including: standard electrical wiring; telephone wiring; loud speaker wiring; low voltage wiring applications such as intercoms and security systems; under surface lighting; and cable TV wiring. In addition, the present invention includes several unique outlets and switches that interface with existing conventional round wiring. Moreover, the present invention also utilizes tape, stripping tools, and unique connectors to implement a particular system embodiment. Each of the individual components will be discussed in greater detail, followed by a description of the applications to which the present disclosure is directed.

Each of the individual wire embodiments share a basic common structure. However, depending on the particular application, various modifications can be made to the basic structure and the dimensions of the structural components to achieve the desired purpose.

For ease of reference, the basic structure will be discussed in detail with reference to the first wire embodiment. It is understood that this basic structural concept applies to all the wire embodiments. Modifications to the basic structure will be discussed where appropriate. Like reference numbers will be used where possible to refer to similar parts throughout the drawings.

Wire Embodiments

Alternating Current (AC) Electrical Wire

Figure 1:
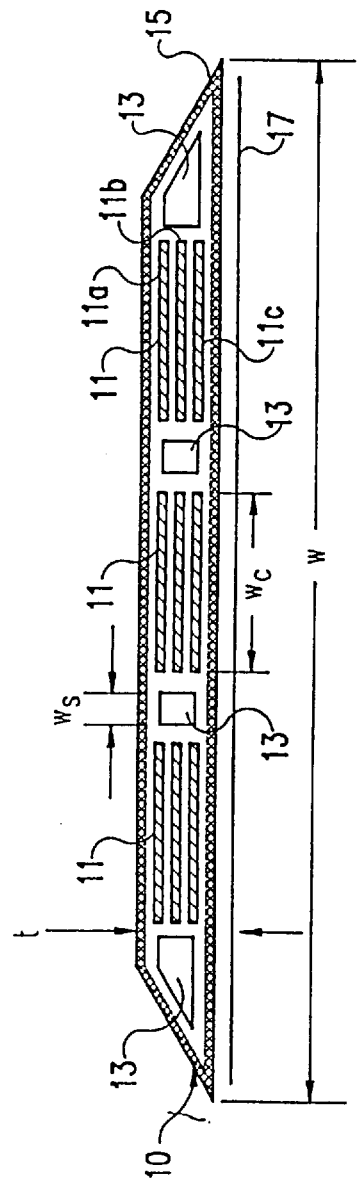
FIG. 1 is an exploded side cross-sectional view of a 3-wire flat conductor for use in standard electrical wiring applications.

Referring now to the drawings, and more particularly to FIG. 1, there is shown an exploded side cross-sectional view of a standard 110 VAC 3-conductor wire embodiment in accordance with the present invention. The exploded cross-sectional view is for illustrative and discussion purposes only. In the actual 3-conductor embodiment, there would be no visible spacings (i.e., the white areas in FIG. 1) between the conductors, insulation, and adhesives components, each of which is described further below.

Generally, the electrical wire 10 is a flat, flexible, wire that allows the user to bring electricity to any area of a wall or ceiling in a room. The electrical wire 10 is mounted to the surface of the wall or ceiling, thereby eliminating the need for costly inner wall or ceiling rewiring. The wire may be painted or papered over to match the rest of the surface.

The electrical wire 10 comprises a plurality of elongated and parallel spaced multi-layer conductors 11. As shown in FIG. 1, a typical 110 VAC 3-wire embodiment would include an AC ground conductor, an AC neutral conductor, and an AC power conductor.

An internal adhesive material 13 separates the flat conductors 11 as well as providing edge sealing of the outer flat conductors as shown in FIG. 1. The adhesive material 13 and conductors 11 are surrounded by a thin layer of insulation material 15. In addition, an external adhesive layer 17 is applied to the back of the flat wire to attach the electrical wiring to the desired surface.

Each of the conductors 11 are comprised of one or a plurality of layers made with a copper material that is about 0.0004 to about 0.020 inches thick, and preferably on the order of about 0.002 inches thick. Three copper layers 11$a$, 11$b$, and 11$c$, are shown in FIG. 1 for example. The conductor layer thickness should be consistent across its length and width, thereby eliminating any resistance "hot spots".

The current and or signal carrying specifications of a particular application may be accomplished in any of three ways, either individually or in combination. First, the width '$w_c$' of the conductors 11 may be varied. Second, additional thin copper layers may be stacked for each conductor 11. Third, the thickness '$t$' of the conductor 11 may be increased.

For most load and current applications, each conductor will generally be composed of about 2–5 layers of copper. It is understood, however, that utilizing more or less layers, for each of the below disclosed embodiments, is within the scope of this invention.

For example, a five copper layer conductor, where each copper layer is about 0.002 inches thick, will be on the order of 0.012 inches thick including insulation. Even at that thickness, however, the flat wire presents an extremely thin cross-section that is virtually undetectable on a surface once painted or papered over.

The insulation layer 15 will now be described in greater detail. Insulation is achieved with minimum thickness to prevent conduction under ideal conditions only. The primary purpose of the insulation layer 15 is to assist in the optical occlusion of the presence of the wire as applied to a surface so that a pleasing appearance can be achieved upon installation.

The insulation layer 15 also orients the copper conductive layers. In addition, the insulation material may be used alone, or in combination with the internal adhesive 13, to separate the conductive layer groups and maintain a safe dielectric distance between conductors of different purposes (e.g., AC ground vs AC neutral or AC power conductors).

As shown in FIG. 1, the insulation layer 15 at the edges of the multi-layered flat wire 10 may be, but need not be, tapered to facilitate the optical occlusion. The insulative material may be selected from the group consisting of, for example, polyester films (e.g., Dupont Mylar), urethane films, or teflon films.

It is understood that additional insulative materials are considered to be within the scope of this invention and may be used so long as the insulation is compliant, paintable, and bondable to surfaces. The insulation should also be compatible with joint compounds, be UV tolerant, and have similar thermal expansion and contraction characteristics as that of the conductors and the surface to which it is adhered.

Other desirable properties are that the insulation should withstand tensile forces applied in the fabrication process, not retract or relax under storage conditions, and be removable when its use is completed.

Any abrasion, cracking, cutting, piercing, or any other insulation damage—that would render an unsafe exposure to electrical harm—will be made safe using electronic means of failure detection that will disconnect harmful currents from the user in a time frame that will prevent permanent harm. This electronic failure detection means, or Ground Fault Interrupter (GFI) circuit, is discussed in greater detail later in the specification.

Returning to FIG. 1, the internal adhesive material 13 must be able to bond to the insulation layer 15. For example, adhesive tape (e.g., 3M 9500PC), liquid adhesive, or a combination of the two, may be used as an internal adhesive. The internal adhesive material 13 will also function to separate the conductive layer groups and maintain a safe dielectric distance between conductors of different purposes. In addition, the adhesive 13 can even out gaps in the various components within the wire to aid in its ability to visually disappear on a surface.

The thickness of the internal adhesive material 13 closely approximates the cross-sectional height 't' of the conductors 11, especially where the internal adhesive separates the conductors 11. As shown in FIG. 1, the internal adhesive 13 may be tapered at the edges of the flat wire 10 to facilitate the optical occlusion.

An external adhesive layer 17 is provided for attaching the wire to the desired surface. The external adhesive layer 17 could be, for example, two-sided tape, with one side being fixed to the back of the flat wire 10 and the other to the wall or surface. Alternatively, a chemical adhesive may be applied separately, and may consist of any of the adhesives with good bonding qualities to both the insulation layer 15 and the desired surface to which the flat wire 10 is adhered.

A finished flat 3-conductor wire 10, having, for example, three copper layers of 0.002 inch thickness, would be approximately 0.007 to 0.010 inches in cross-sectional height 't'. For a 15 amp rated wire, the entire width 'W' of the 3-conductor flat wire 10 is on the order of about 2.0–2.5 inches. The width '$w_c$' of each conductor is about 0.4–0.6 inches, and the spacing between conductors '$w_s$' is about 0.2–0.3 inches.

To ensure readily identifiable, proper and safe connections, the width '$w_c$' of the AC ground conductor could be increase slightly as compared to the AC neutral and AC power conductors. The width of the AC ground conductor would therefore be closer to 0.6 inches, while the widths of the other two conductors would be closer to 0.4 inches. Alternatively, the width of the AC ground conductor could be reduced as compared to the other conductors.

Similar dimensions would be useful for other applications, however, it is understood that the various dimensions can vary considerably within the practice of this invention.

The flat wire 10 provides a simple, low cost alternative to expensive rewiring jobs for supplying electricity to specific locations of walls and ceilings for use in fans, ceiling lighting, or wall or art lighting.

While other conductive materials, for example, aluminum, gold, silver, zinc or alloys thereof, may be used with the present invention, copper is preferably used for the conductors, because it provides excellent conductivity at a relatively low material cost. Therefore, while any conductive material may be utilized, the cost of a particular conductive material and its relative conductivity while dictate whether the material is a commercially viable option.

Of course, the width or thickness of the conductors will vary somewhat when materials other than copper are employed. When using materials other than copper, it is preferable to maintain the same conductor thickness for the same current rating so that the cross-sectional area of the flat-wire is kept to a minimum. Accordingly, for those conductive materials having a lower conductivity than copper, the conductive layers would be wider, and for those conductive materials having a higher conductivity than copper, the conductive layers would be narrower. Alternately, the width of the conductors could be kept constant and the thickness may be increased or decreased depending on the particular material used. Also, when using conductive material other than copper, it is preferable to keep the spacing between the conductors the same to prevent arcing.

For example, when using aluminum as the conductive material, the width '$w_c$' of each conductor would be increased by about 30%. In other words, a finished flat 3-conductor wire 10, having, for example, three aluminum layers of 0.002 inch thickness, would still be approximately 0.007 to 0.010 inches in cross-sectional height 't'. For a 15 amp rated wire, the entire width 'W' of the 3-conductor flat wire 10 is on the order of 2.6–3.25 inches. The width '$w_c$' of each conductor would be about 0.5–0.8 inches, and the spacing between the conductors '$w_s$' would remain about 0.2–0.3 inches.

Figure 21:
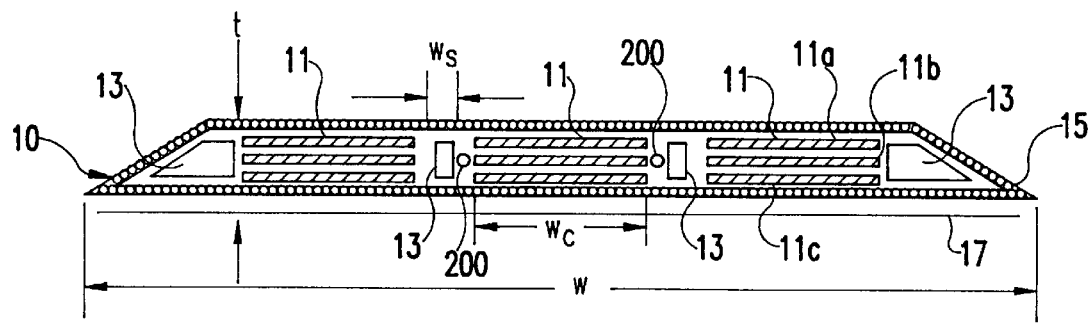
FIG. 21 is an exploded side cross-sectional view of the three-wire flat conductor of FIG. 1 including optical fibers embedded therein.

In addition, the present invention may incorporate optical fibers 200 for carrying optical information as shown in FIG. 21. The conductors 11 may be "current carrying conductors" for use in electrical and optical information transfer within the same wire. Alternately, the conductors 11 may be "non-current carrying conductors", where only optical information is transferred and where the metal layers (of the conductors 11) merely serve as stiffeners for the optical fibers 200.

Preferably, the optical fibers 200 would be located in close proximity to the conductors, either current carrying or non-current carrying, to provide some rigidity and support for the fibers. Also, it is preferable that the optical fibers 200 be located outside the area of any adhesive material 13 that is utilized so that the optical fiber may have some freedom of movement to reduce the possibility of breakage.

The diameter of the optical fibers 200 is preferably less than the cross-sectional height 't' of the wire to protect the fibers from being contacted should the wire be compressed or put under an exterior load, inadvertently or otherwise.

Figure 2:
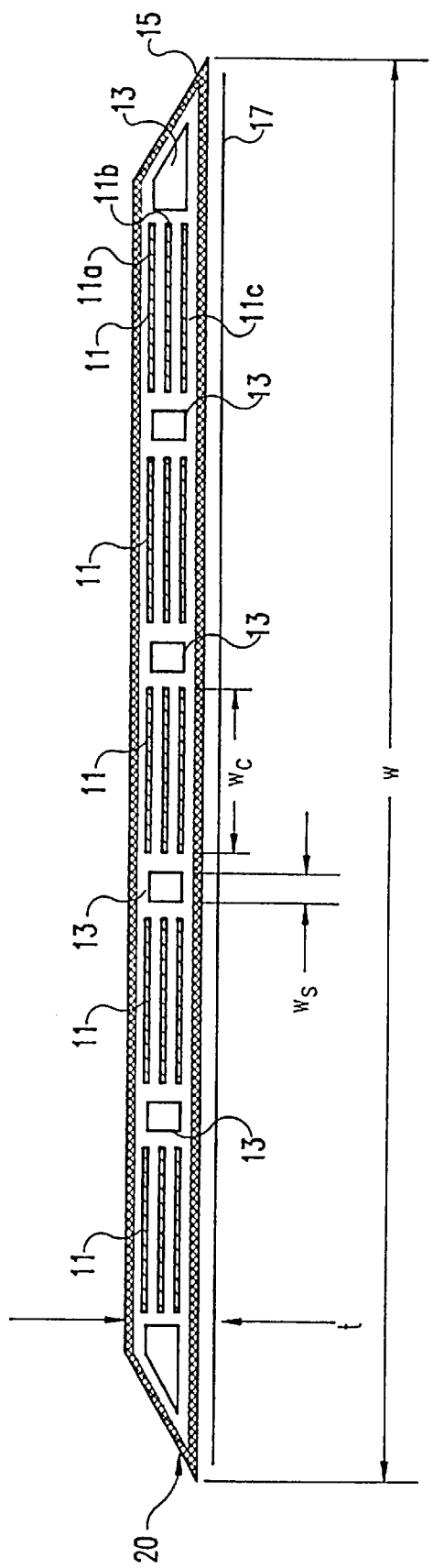
FIG. 2 is an exploded side cross-sectional view of a 5-wire flat conductor for use in applications requiring two circuits.

In FIG. 2, there is shown an exploded side cross-sectional view of a 110 VAC 5-conductor wire 20 of the present invention, having 5 parallel spaced multi-layered copper conductors 11. This 5-conductor wire embodiment includes all of the features of the 3-conductor wire embodiment disclosed above, with the addition of two conductors 11 to accommodate a second circuit. Like or similar parts are identified by the same reference numerals.

The 110 VAC 5-conductor wire is used where two circuits on one flat wire are desirable, such as a wire leading to a light and a fan, or where a switched plug is used. In this embodiment, the five conductors consist of two AC neutral conductors, two AC power conductors, and a single AC ground conductor.

The number and thickness of the copper layers, the width $w_c$' and thickness 't' of the conductors 11, and the spacing between the conductors $w_s$' are generally of the same dimensions as that of the 110 VAC 3-conductor wire. The overall width 'W' of the finished flat wire 20 is on the order of about 3.5–4.25 inches.

As described previously with regard to FIG. 1, different conductive materials may be utilized for the conductors of FIG. 2, with an accompanying increase or decrease in the conductor width '$w_c$' and/or thickness depending on the conductive material employed. For example, when using aluminum as the conductive material, the width '$w_c$' of each conductor would be increased by about 30%. Also, optical fibers 200 may be incorporated as described with regard to FIG. 21.

The flat wire conductors of the present invention may also be utilized to construct a 220 VAC wire embodiment, generally as shown with reference to FIG. 1. A finished flat 3-conductor 220 VAC wire, having, for example, four copper layers of about 0.002 inch thickness, would be approximately 0.012 inches in cross-sectional height 't'. The entire width 'W' would be on the order of about 3.0–3.5 inches. The width '$w_c$' of the neutral and power conductors is about 0.4–0.6 inches, while the width '$w_c$' of the ground conductors is about 0.2–0.4 inches. The spacing between conductors '$w_s$' is about 0.4–0.6 inches.

As in the 3-conductor 110 VAC electrical wire, the difference in ground conductor width in the 3-conductor 220 VAC electrical wire is to facilitate proper connection of the wires to the connectors.

As described previously, different conductive materials may be utilized for the conductors, with an accompanying increase or decrease in the conductor width '$w_c$' and/or thickness depending on the conductive material employed. For example, when using aluminum as the conductive material, the width '$w_c$' of each conductor would be increased by about 30%. Also, optical fibers 200 may be incorporated in the structure with the characteristics noted previously.

Loud Speaker Wire

As with the previous embodiments, the loud speaker wire 30 of the present invention, illustrated in FIG. 3, is a flat, thin, flexible, wire that allows the user to position loud speakers at any area of a wall or ceiling in a room. The loud speaker wire 30 may be used, for example, with stereo or mono audio components, or for wiring external speakers for enhanced television or sound systems such as "surround sound".

The loud speaker wire 30 can be mounted to the surface of a wall or ceiling, thereby eliminating the need for costly inner wall or ceiling rewiring. The wire may also be painted or papered over to match the rest of the surface.

Referring to FIG. 3, the thin loud speaker wire 30 is comprised of a pair of multi-layered copper conductors 11. The conductive capacity of the loud speaker wire 30 is preferably equivalent to 10 gauge stranded wire. Each of the conductors 11 would generally have two or three copper layers, the former being shown by copper layers 11a and 11b in FIG. 3. The copper layers are about 0.0004 to about 0.020 inches thick, and preferably on the order of about 0.002 inches thick. It is understood that, depending on the particular application, more or less copper layers may be utilized.

The pair of conductors 11 are separated by an appropriate adhesive material 13 and both are surrounded by an insulation layer 15 as discussed above. Similar insulation and adhesives may be used as previously described above.

Because of its application, the loud speaker wire 30 may also include a shielding material 18 surrounding the conductors 11 to reduce outside signal and cross-over interference. The shielding material 18 may be one or a plurality of layers of any suitable metallic or semi-metallic shielding materials, for example, aluminum or metalized polyester films.

The finished loud speaker wire 30 is approximately 0.008 inches in cross-sectional height 't' with three copper layers, with an overall width 'W' of about 2.5–3.0 inches. The width '$w_c$' of each conductor is about 0.6–0.8 inches, and the spacing between the conductors '$w_s$' is about 0.2–0.3 inches.

As described previously, different conductive materials may be utilized for the conductors, with an accompanying increase or decrease in the conductor width '$w_c$' and/or thickness depending on the conductive material employed. For example, when using aluminum as the conductive material, the width '$w_c$' of each conductor would be increased by about 30%. Also, optical fibers 200 may be incorporated in the structure with the characteristics noted previously.

As shown in FIG. 3, the edges of the wire 30 may be tapered to facilitate the optical occlusion. A similar external adhesive layer 17 as that previously described is also provided to attach the loud speaker wire 30 to the appropriate surface.

Telephone Wire

An illustrative example of a telephone wire embodiment 40 according to the present invention is shown in FIG. 4. In this embodiment, six multi-layered copper conductors 11 are provided, separated by adhesive material 13, and surrounded by insulation layer 15. A six conductor wire facilitates the use of Private Branch Exchange (PBX) switching, thereby providing a private telecommunications exchange that includes access to a public telecommunications exchange. The conductors 11 are functionally equivalent to standard 22 gauge telephone wire.

Two, four, and eight multi-layered copper conductor telephone wires may also be utilized. Moreover, the eight conductor embodiment approximates four twisted pair wires (e.g., unshielded twisted pair (UTP) wire), which may be suitable for carrying data.

Each of the conductors 11 would generally have two or three copper layers, the former being shown by copper layers 11a and 11b in FIG. 4. The copper layers are about 0.0004 to about 0.020 inches thick, and preferably on the order of about 0.002 inches thick. It is understood that, depending on the particular application, more or less copper layers may be utilized.

The finished telephone wire 40, with three copper layers, is approximately 0.008 inches in cross-sectional height 't', with an overall width 'W' of about 1.5–3.5 inches, depending on the number of conductors 11 utilized. The width '$w_c$' of each conductor is about 0.2–0.4 inches, and the spacing between the conductors '$w_s$' is about 0.125–0.25 inches.

As described previously, different conductive materials may be utilized for the conductors, with an accompanying increase or decrease in the conductor width '$w_c$' and/or thickness depending on the conductive material employed. For example, when using aluminum as the conductive material, the width '$w_c$' of each conductor would be increased by about 30%. Also, optical fibers 200 may be incorporated in the structure with the characteristics noted previously.

As shown in FIG. 4, the edges of the wire 40 may be tapered to facilitate the optical occlusion. A similar external adhesive layer 17 as that previously described is also provided to attach the telephone wire 40 to the appropriate surface.

Cable Television CATV Wire

An illustrative example of a cable television CATV wire embodiment 50 in accordance with the present invention is shown in FIG. 5. In this embodiment, a pair of conductors 11 are provided, each of which may generally have two or three copper layers, the former being shown by copper layers 11a and 11b in FIG. 5. The copper layers are about 0.0004 to about 0.020 inches thick, and preferably on the order of about 0.002 inches thick. It is understood that, depending on the particular application, more or less copper layers may be utilized.

As in the previous embodiments, the conductors 11 are separated by adhesive material 13, and surrounded by insulation layer 15. As shown in FIG. 5, the edges of the wire 50 may be tapered to facilitate the optical occlusion. A similar external adhesive layer 17 as that previously described is also provided to attach the wire 50 to the appropriate surface.

The finished antenna/CATV wire 50, with three copper layers, is approximately 0.008 inches in cross-sectional height 't', with an overall width 'W' of about 1.8–2.2 inches. The width '$w_c$' of each conductor is about 0.4–0.6 inches. As shown in FIG. 5, the spacing between the conductors '$w_s$' is about 0.4–0.6 inches, which is somewhat larger than in previous embodiments in order to reduce radio frequency interference and improve transmission quality. The CATV wire is rated at 300 ohms.

As described previously, different conductive materials may be utilized for the conductors, with an accompanying increase or decrease in the conductor width '$w_c$' and/or thickness depending on the conductive material employed. For example, when using aluminum as the conductive material, the width '$w_c$' of each conductor would be increased by about 30%. Also, optical fibers 200 may be incorporated in the structure with the characteristics noted previously.

Low Voltage Wire Applications

FIG. 6 illustrates a low voltage wire embodiment 60 in accordance with the present invention. Such low voltage (direct current) applications would include intercoms, security systems, and "smart house products". As shown in FIG. 6, two DC power conductors 11 are shown. The structure of the conductors 11 is essentially the same as the multi-layer conductors 11 described earlier. The internal adhesive material 13, insulation layer 15, and external adhesive layer 17, would be the same in this embodiment as those described previously.

Each of the conductors 11 would generally have two or three copper layers, the later being shown by copper layers 11a, 11b, and 11c in FIG. 6. The copper layers are about 0.0004 to about 0.020 inches thick, and preferably on the order of about 0.002 inches thick. It is understood that, depending on the particular application, more or less copper layers may be utilized.

The finished low voltage wire 60, with three copper layers, is approximately 0.008 inches in cross-sectional height 't', with an overall width 'W' of about 1.2–1.6 inches. The width '$w_c$' of each conductor is about 0.3–0.5 inches, and the spacing between the conductors '$w_s$' is about 0.2–0.3 inches.

As described previously, different conductive materials may be utilized for the conductors, with an accompanying increase or decrease in the conductor width '$w_c$' and/or thickness depending on the conductive material employed. For example, when using aluminum as the conductive material, the width '$w_c$' of each conductor would be increased by about 30%. Also, optical fibers 200 may be incorporated in the structure with the characteristics noted previously.

As shown in FIG. 6, the edges of the wire 60 may be tapered to facilitate the optical occlusion. A similar external adhesive layer 17 as that previously described is also provided to attach the telephone wire 60 to the appropriate surface.

Under Surface Lighting Wire

While the thin, flexible wire for under surface lighting is similar in construction to the 110 VAC 3-conductor and 5-conductor wire embodiments described above, it is unique in that the under surface lighting wire incorporates embedded lights 169. See FIG. 16. This allows the user to install the lighting under a surface of a cabinet, shelf, or other locations where under surface lighting is desired. This embodiment will be described in greater detail in the discussions of the conventional wire-to-flat wire system implementations later in the specification.

Outlets and Connectors

The present invention encompasses a family of outlets that provide connection points between the flat wires of the present invention and conventional existing electrical outlets and conventional round wire systems. These connecting outlets are of two general types, with one being directly "pluggable" into a conventional existing outlets, while the other is a "stand-alone" surface mounted unit.

The pluggable connecting outlets will always provide the compatibility interface between the standard household electric wiring apparatus and the various embodiments of the flat wires in accordance with the present invention. Accordingly, the pluggable outlet is always at the source of the standard electrical current. The stand-alone unit interfaces with the pluggable unit via the various flat wire embodiments of the present invention.

FIG. 7 illustrates the typical configuration interface between the pluggable and stand-alone units. Assuming that a conventional two-female receptacle outlet, as fed by conventional round wire 69 from behind the wall 66, is located behind outlet 65. Outlet 65 would therefore be of the directly "pluggable" variety. Outlet 67 would thus be a stand-alone outlet that is affixed to the wall without a plug attachment. The stand-alone outlet can therefore be placed anywhere in the room, regardless of the location of the existing outlets.

In the electrical wire embodiments, for example, current from the conventional wire 69 is transferred to the stand-alone outlet 67 via pluggable outlet 65 and the flat 110 VAC wire 68 of the present invention.

Figure 8A:
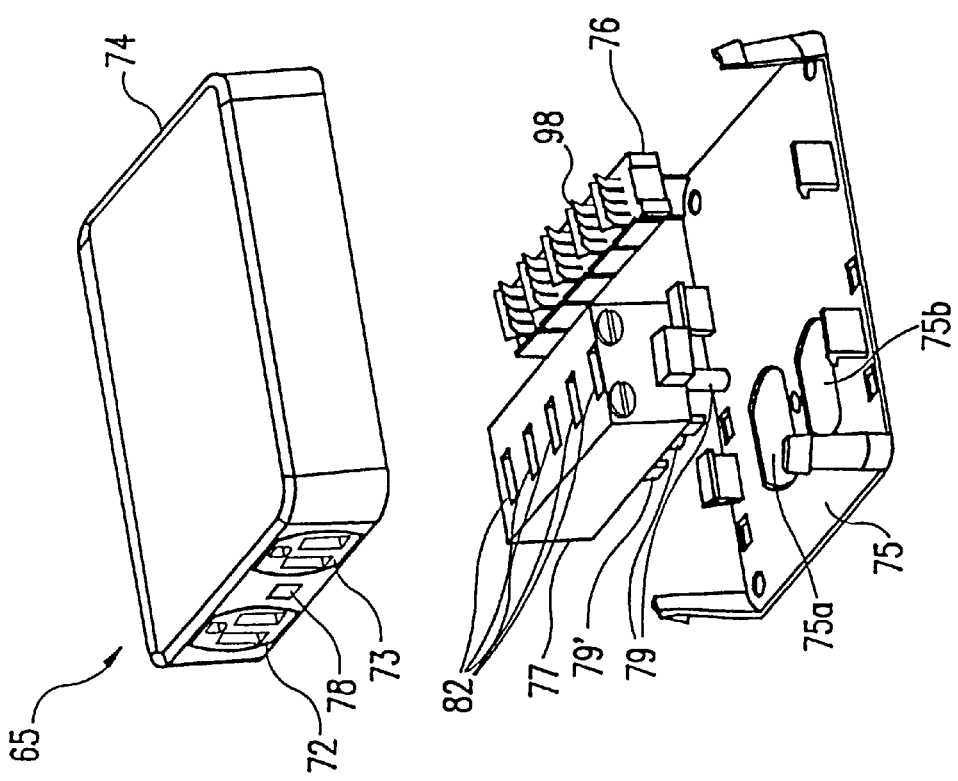
FIG. 8A is an exploded perspective view of the components of the outlet assembly of the present invention.

FIG. 8A is an exploded perspective view of the pluggable outlet unit 65, depicting the various internal and external components of the outlet. As shown, the outlet 65 contains side mounted female receptacles 72 and 73 housed within an outlet cover 74. Alternatively, the female receptacles 72 and 73 may be mounted in the front as in standard outlet configurations. The side mounted receptacle version has an advantage in that the outlet cover 74 may be painted or papered to blend into the surface. Also, additional female receptacles 72' and 73' may be located on another side of the outlet cover 74 as in FIG. 8B, which shows four female receptacles.

The outlet base 75 for the pluggable outlet 65 contains openings 75a and 75b that would be positioned over the female receptacles of the conventional existing outlet, and affixed to the surface with screws or other equivalent attachment devices. The outlet cover 74 would then be placed over the base 75.

The pluggable outlet 65 also contains a flat wire connector 76 and a Ground Fault Interrupter (GFI) module 77 with its associated GFI reset button 78. The GFI module 77 (the operation of which is discussed later in the specification) contains two sets of male contacts 79 and 79' that pass through the openings 75a and 75b to plug into the respective female receptacles associated with conventional wiring systems. The GFI module 77 functions to interrupt the electric current to the load in the event the flat wire is pierced or cracked. FIG. 8C provides a perspective view of the underside of a completed pluggable outlet assembly 65, depicting the GFI male contacts 79 and 79' extending through the base member 75 through openings 75a and 75b.

The stand-alone outlet 67 (see FIG. 7) differs from the pluggable outlet 65 in two respects. First, there is no need to provide for a GFI module 77 and its associated reset button 78 in the stand-alone outlet. Second, the stand-alone outlet's base 75 does not need openings 75a and 75b as the stand-alone outlet does not interface directly with the conventional wiring system. In all other respects, the pluggable and stand-alone outlets are the same.

A single outlet base 75 may be configured with "punch out" openings 75a and 75b so that it may be used with either the pluggable or stand-alone outlet assemblies.

Figure 8B:
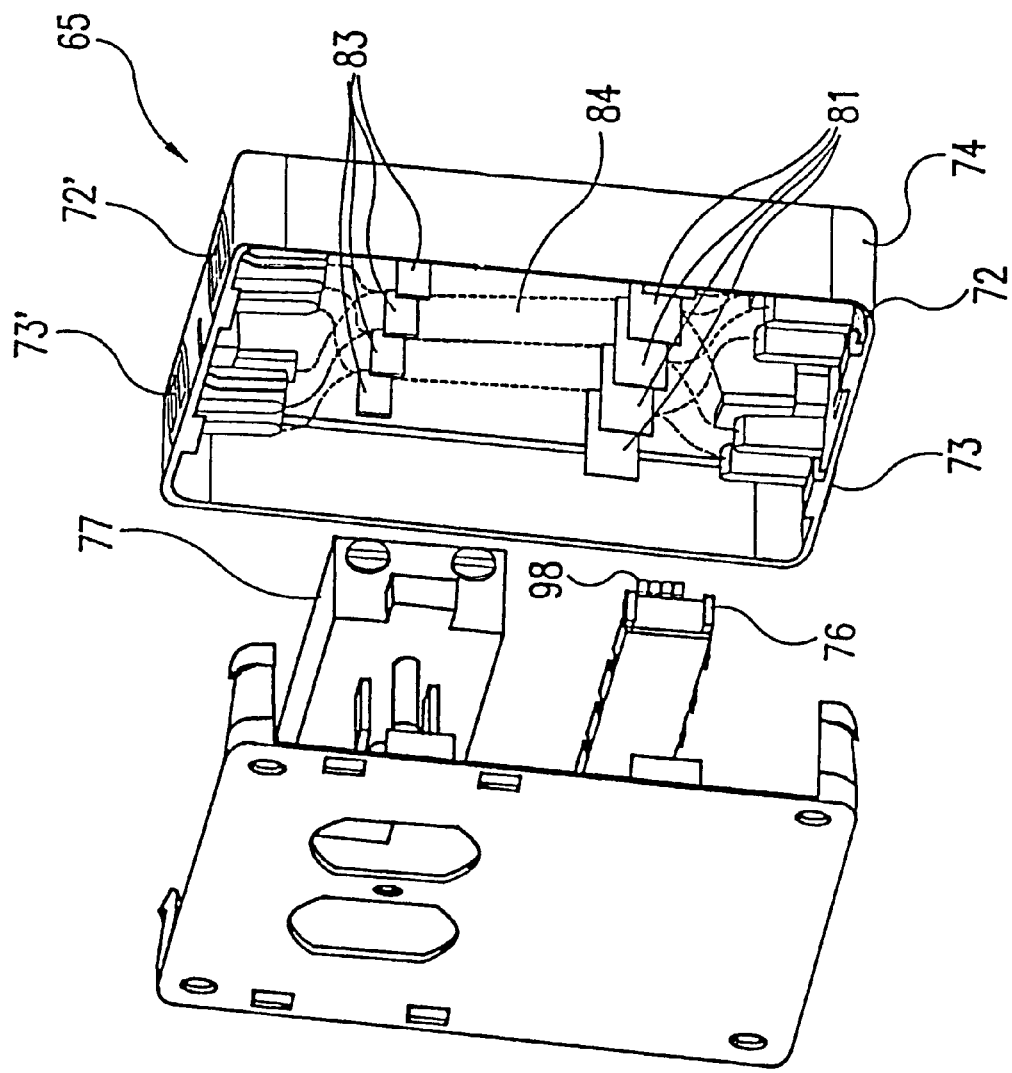
FIG. 8B is an alternate exploded perspective view of the components of the outlet assembly of the present invention.
Figure 8C:
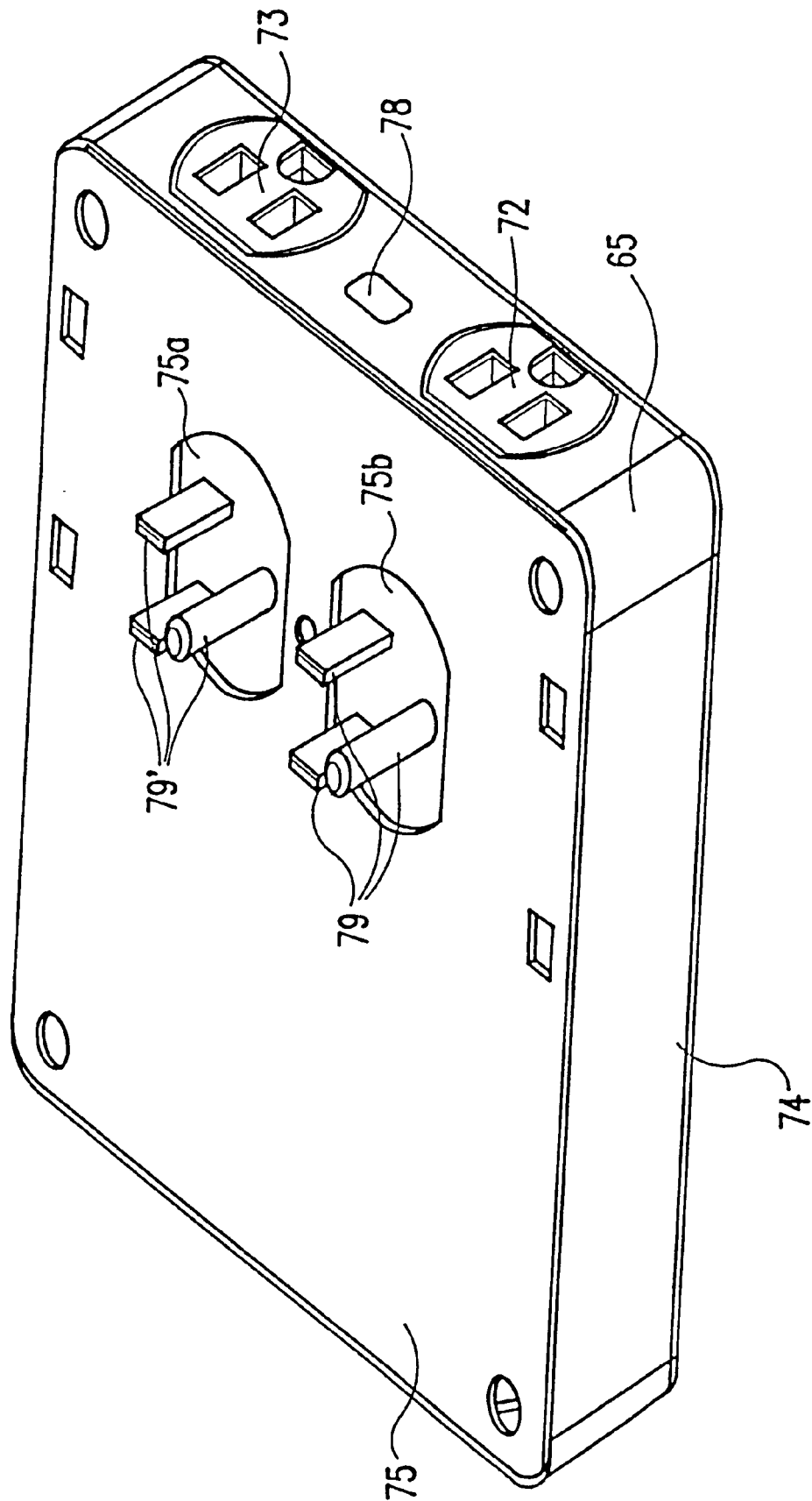
FIG. 8C is a perspective view of the underside of a fully configured outlet assembly of the present invention.

FIG. 8B is an alternate perspective view of the pluggable outlet unit 65, depicting the two sets of male contacts 81 and 83, which interface with the flat wire connector 76 and GFI module 77, respectively. Note that the flat wire connector 76 and GFI module 77 are not affixed to the base member 75, but are selectively connected to the outlet cover 74 by the male contacts 81 and 83.

Also depicted in FIG. 8B is copper frame 84 on the underside of cover 74. The copper frame 84 functions to provide conductive connections to female receptacles 72, 72', 73, and 73', and the two sets of male contacts 81 and 83. The male contacts 83 plug into corresponding slots 82 on one surface of the GFI module 77 as shown in FIG. 8A.

The flat wire connector 76, which is common to both the stand-alone and pluggable outlets, will now be discussed in greater detail. The flat wire connector 76 provides the connection point between the flat wires of the present invention and the copper outlet frame 84.

Figure 9A:
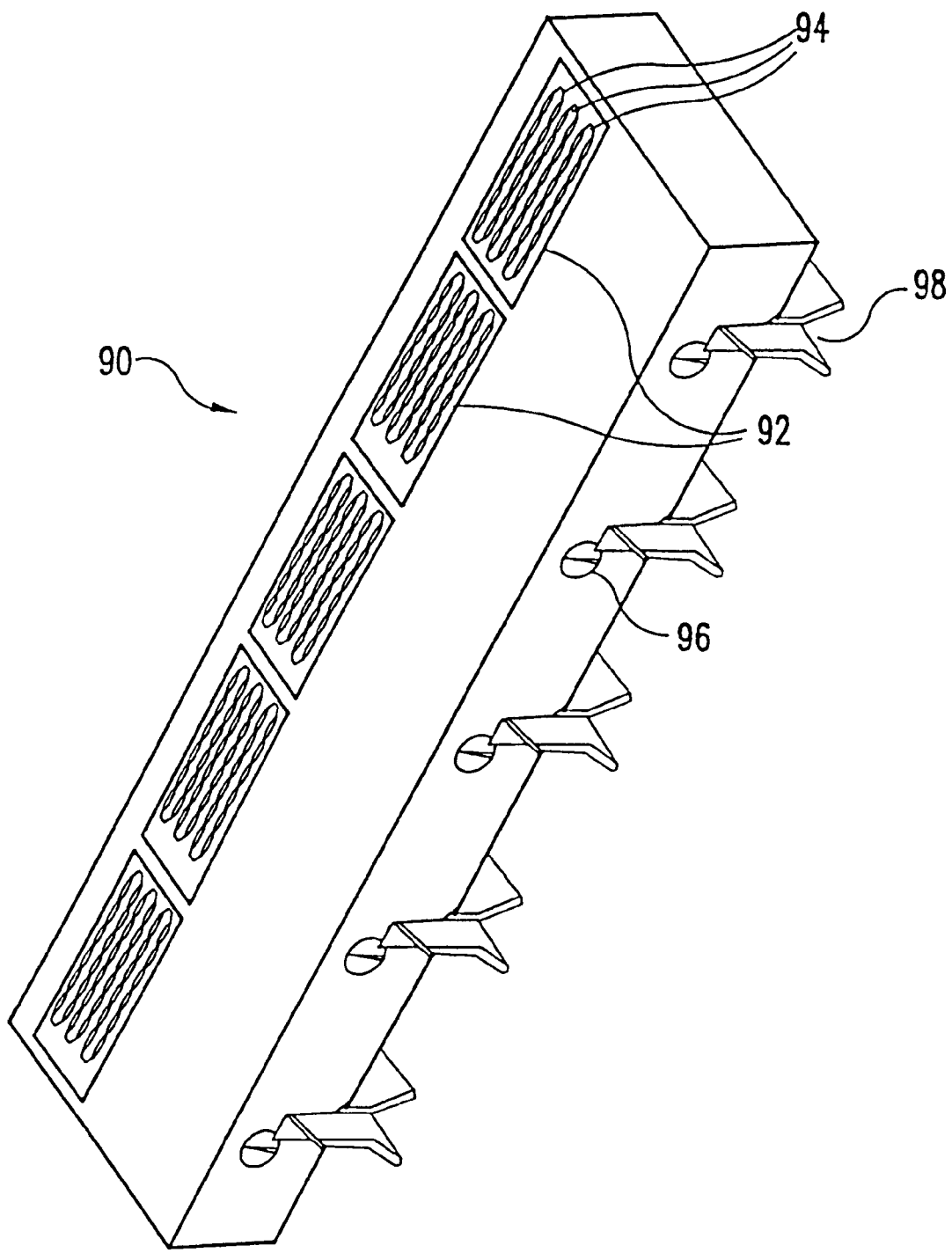
FIG. 9A is a perspective view of the flat-wire to outlet frame connector interface in accordance with the present invention.

An example of such a "flat-wire to outlet frame" connector 90 is illustrated in the perspective view of FIG. 9A. While a 5-conductor connector assembly is shown for illustrative purposes, it is understood that the connector can be constructed to interface with any number of flat conductors having any number of copper layers.

Along one surface of connector 90 there is provided a plurality of flat wire receptacles 92 for receiving each of the flat wire conductors 11. The 3-conductor and 5-conductor electrical wires may use the same 5-conductor connector assembly 90, provided the outer wire receptacles are depopulated when the 3-conductor electrical wire is used. The other wire embodiments would have their own interface connectors 90. The need for multiple connectors does not pose a problem as the connectors can easily be swapped and inserted in the outlet cover 74 by plugging the connector into the male contacts 81 fixed to the outlet cover 74.

Figure 9B:
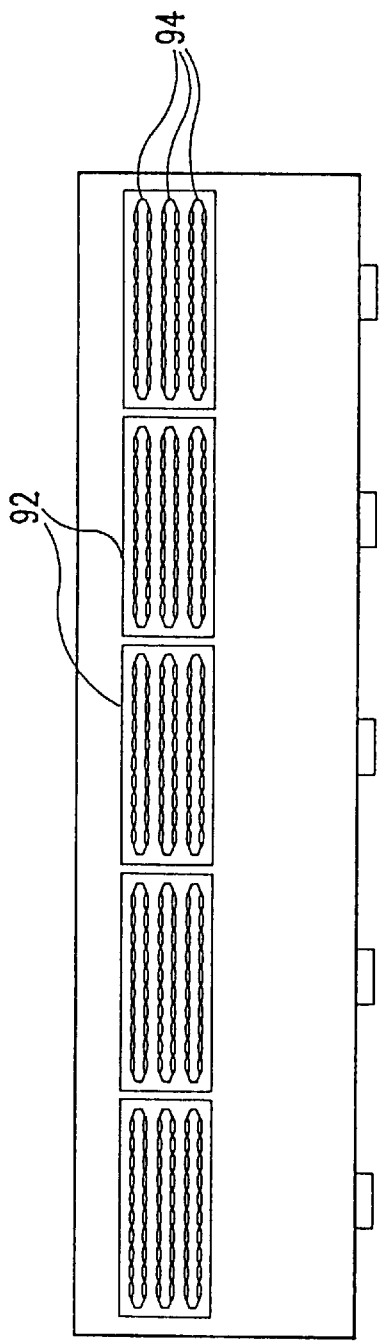
FIGS. 9B, 9C, and 9D provide top, side, and bottom views, respectively, of the flat-wire to outlet frame connector interface in FIG. 9A.

Each of the flat wire receptacles contains a plurality of slotted springs 94 for contacting the corresponding copper layers in each of the multi-layer conductors 11 (see FIG. 9B also). Two to five slotted springs 94 would generally be provided to correspond to the multi-layer copper conductor embodiments discussed above.

Figure 9C:
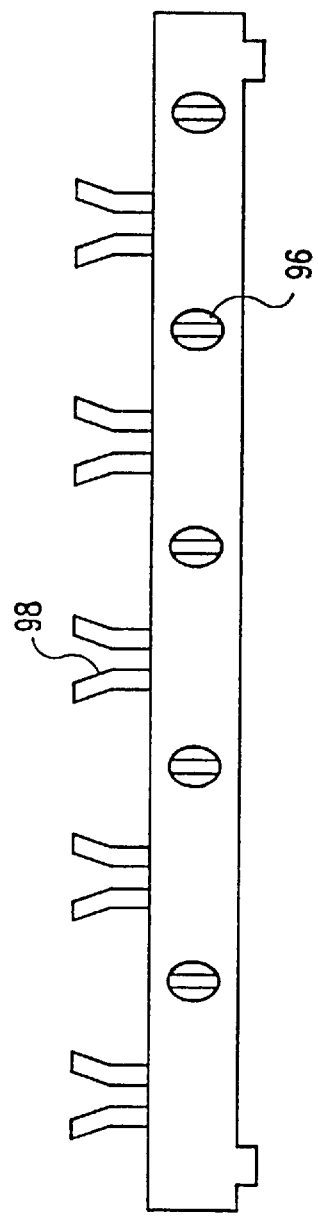
Figure 9D:
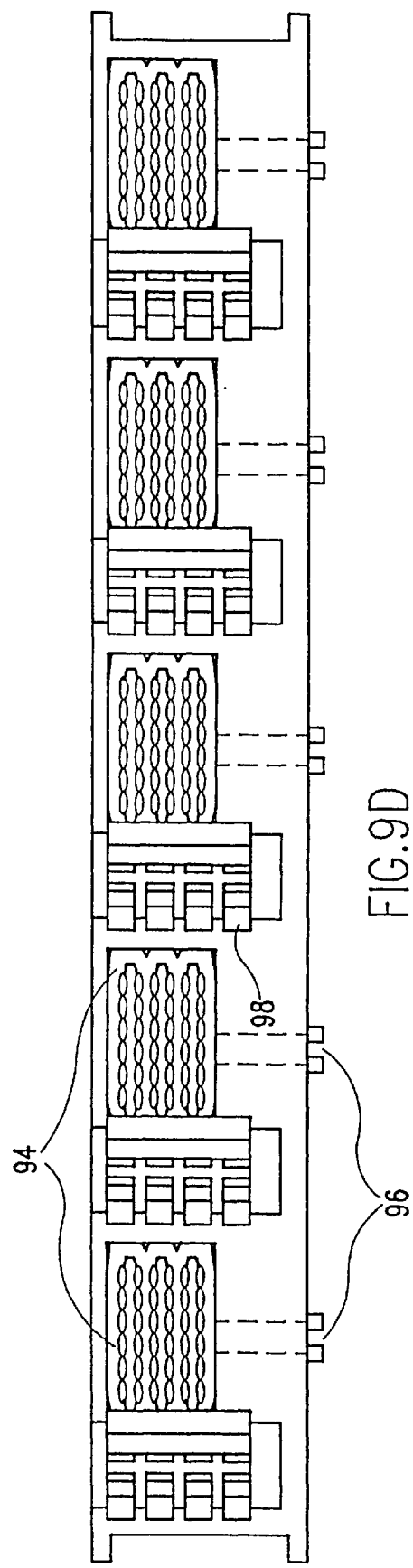
Figure 9E:
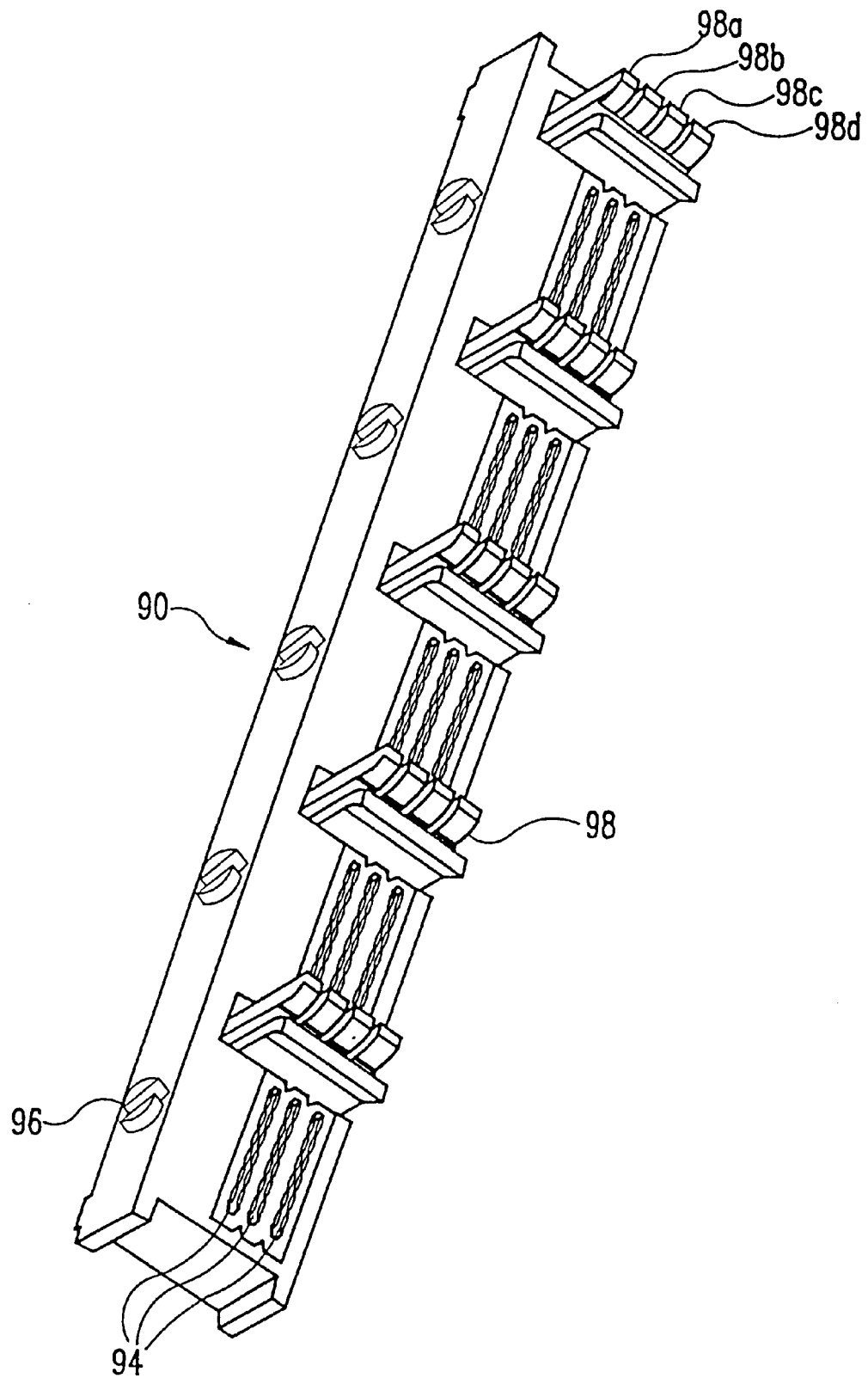
FIG. 9E is a perspective view of the underside of the flat-wire to outlet frame connector of FIG. 9A showing the elongated slots and wipers.

As shown in the perspective views in FIGS. 9A and 9E, and the side view in FIG. 9C, a plurality of elongated female slots 98 are contained on another surface of the connector 90. These elongated female slots 98 interface with the corresponding set of male contacts 81 as shown in FIG. 8B. The male contacts 81 merely slide into slots 98 to make the connection.

As more clearly seen in FIG. 9E, each of the extended slots 98 contain a series of wipers or brushes 98a–98d, each of which moves independently of the others, to provide a better connection and more surface contact with the male contacts 81.

The sequence of connecting the flat wire to the connector 90 is described with reference to an exemplary 5-conductor embodiment where each of the conductors has three copper layers. First, each conductor 11 is lined up with a respective flat wire receptacle 92. Then, each copper layer for each of the conductors 11 is inserted between the slotted springs 94. The slotted springs 94 are slightly biased by screws 96 as shown in FIG. 9D. By tightening the screws, one can ensure that both the top and bottom of each copper layer are in contact with the slotted springs. This ensures the best conductor contact, and also ensures that each copper layer (and thus each conductor) experiences the same resistance.

As described previously, different conductive materials may be utilized for the conductors. Since the width of the conductors using different conductive materials may vary, the flat wire receptacle 92 should be of sufficient width to accommodate the different conductive material widths. In all other respects, the sequence of connecting the flat wire to the connector 90 is the same for copper or any other conductive material.

Finally, the male contacts 81 and extended female slots 98 are lined up and the connection to either the pluggable or stand-alone outlet is made. The outlet cover 74 would have a small cutout at the edge facing the flat wire receptacles 92 of connector 90 to enable the flat wires to pass through the outlet cover 74 to reach the connector 90.

In addition to the flat-wire to outlet frame connector, a second connector type is also needed to provide an interface between conventional round wires and the various flat wire embodiments described above. This would occur, for example, where the flat wires connect to a wall light, fan, or intercom system.

Figure 10A:
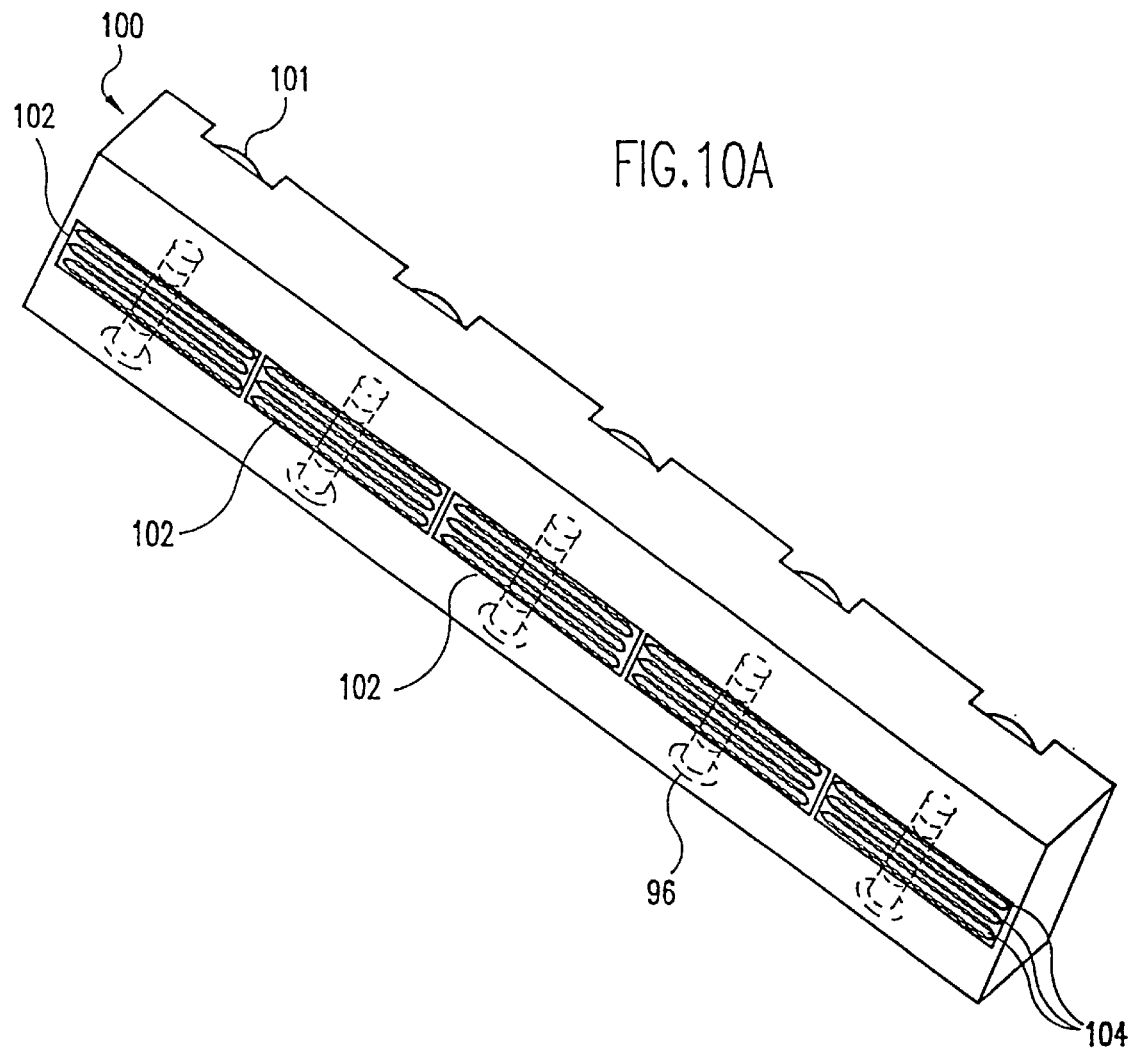
FIG. 10A is perspective view of the flat-wire to conventional-wire connector in accordance with the present invention.

An example of such a connector 100 is illustrated in the perspective view of FIG. 10A, which depicts a 5-conductor flat-wire to conventional wire connector. While a 5-conductor connector is shown for illustrative purposes, it is understood that the connector can be constructed to interface with any number of flat conductors and any number of conventional round wires. The 3-conductor and 5-conductor electrical wires may use the same 5-conductor connector assembly 100, provided the outer wire receptacles are depopulated when the 3-conductor electrical wire is used. The other wire embodiments would have their own interface connectors 100.

Figure 10B:
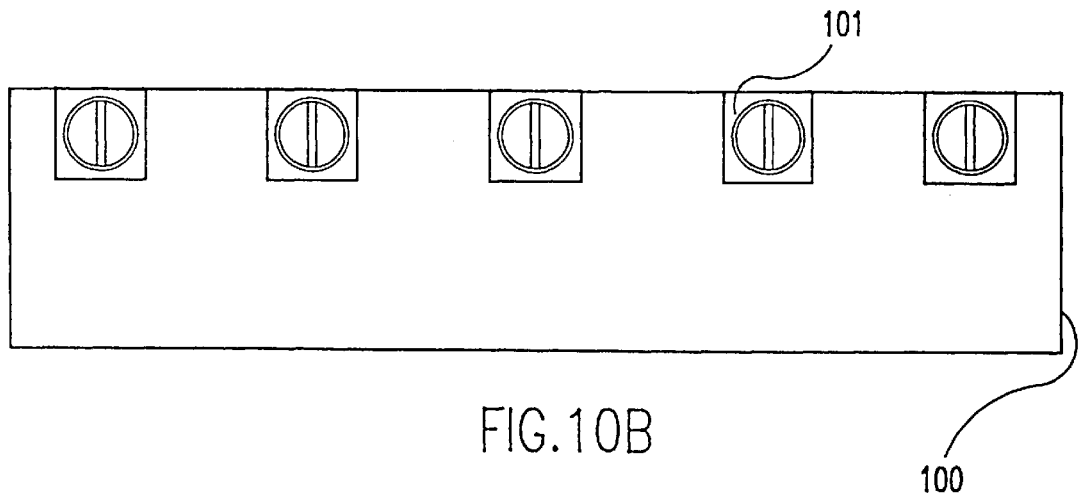
FIGS. 10B, 10C, and 10D provide top, side, and bottom views, respectively, of the flat-wire to conventional-wire connector in FIG. 10A.
Figure 10C:
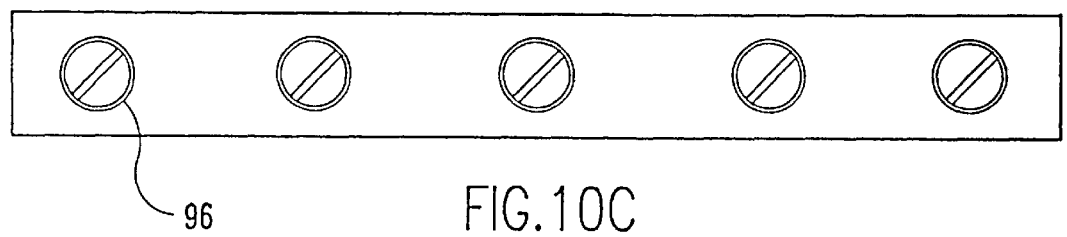
Figure 10D:
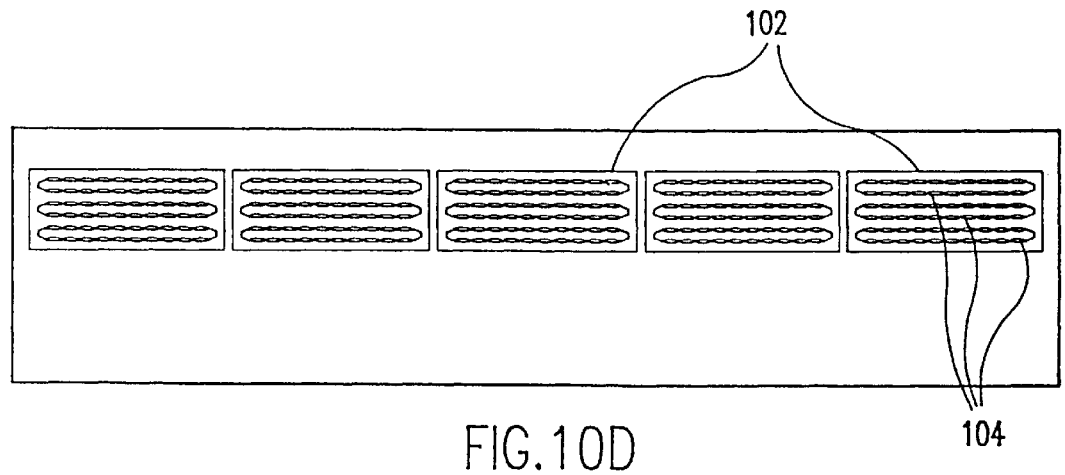

As shown in FIG. 10A, connector 100 contains a plurality of conventional set screws 101 along one surface of the connector to provide an interface for the standard "wire wrap" connections common in conventional round wiring systems (see FIG. 10B also). Along another surface are placed one or more flat wire receptacles 102 for receiving each of the flat wire conductors. Each of the flat wire receptacles 102 contains a plurality of slotted springs 104 (see FIG. 10D also) for contacting each of the layers in each of the multi-layer conductors. The slotted springs 104 are slightly biased by screws 96 as shown in FIGS. 10A and 10C and function in the same way as that described with respect to the connector 90. Connection to the flat-wire receptacles by the flat wire conductors is the same as that discussed with regard to connector 90.

Figure 11A:
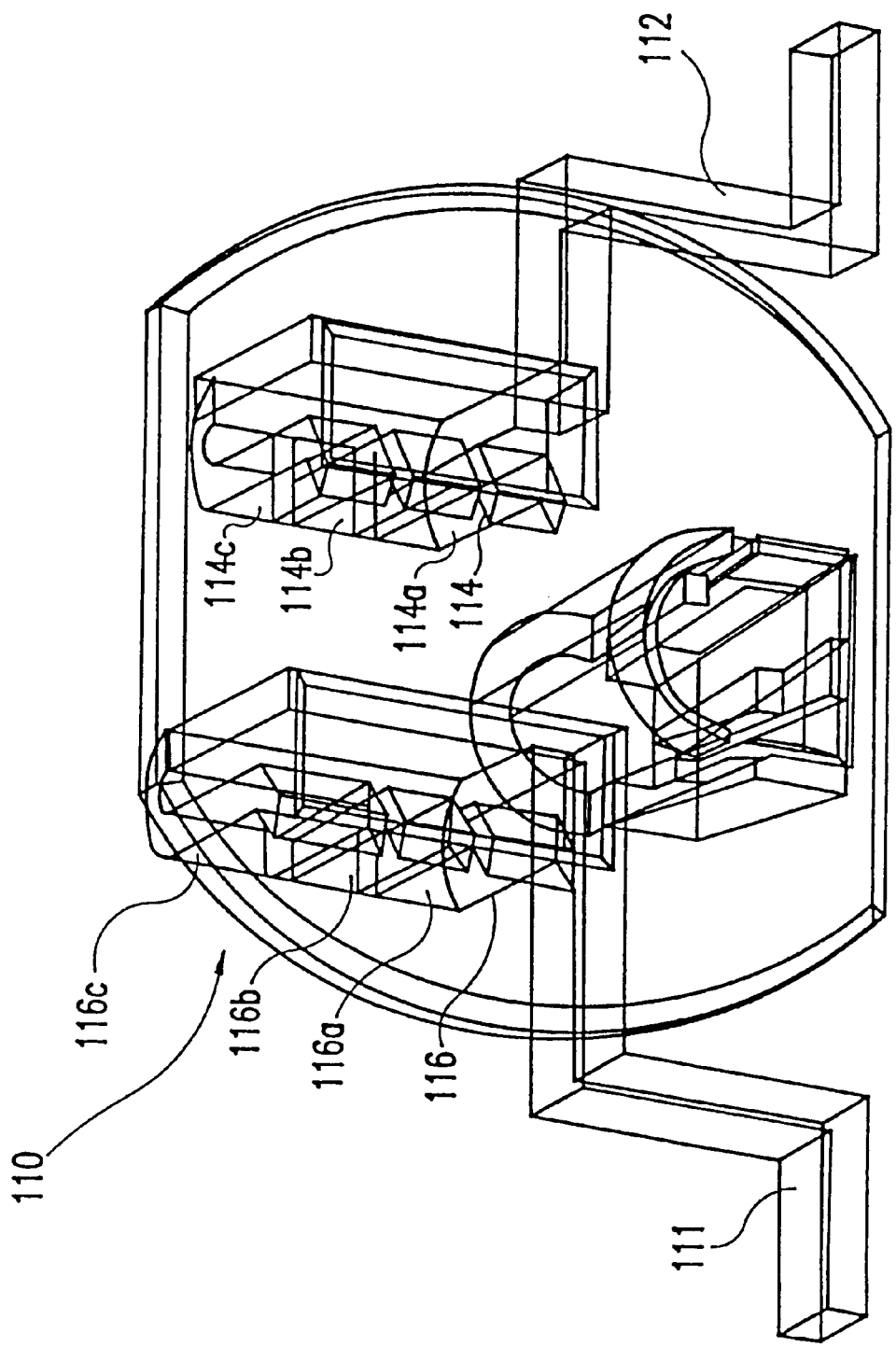
FIG. 11A is a three dimensional perspective view of a three wiper female plug receptacle system according to the present invention.

FIG. 11A depicts an improved three wiper female receptacle 110, which may be incorporated into the pluggable 65 or stand-alone 67 outlets of the present invention.

Receptacle 110 contains cast copper leads 111 and 112 that contact the respective wiper assemblies 114 and 116. Each of the wiper assemblies contains three wipers (114a, 114b, 114c; 116a, 116b, 116c), each of which moves independently of the other two in the respective assembly.

The three-wiper receptacle 110 thus provides a better connection and more surface contact with the copper leads 111 and 112. The other ends of copper leads 111 and 112 extend to the copper frame 84 (see FIG. 8B). In addition, since the three wipers move independently, the receptacle is better able to accommodate torque in a plug.

Figure 22:
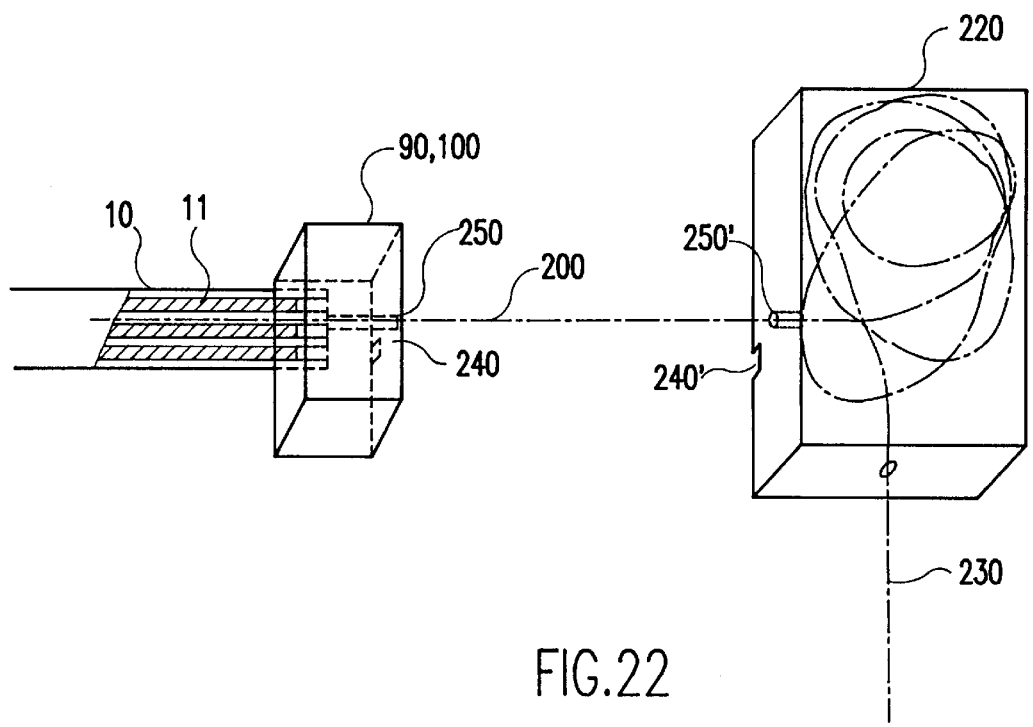
FIG. 22 is a schematic diagram of an exemplary connection for the flat-wire/optical fiber embodiment of the present invention.

In the embodiments incorporating optical fibers 200 as shown in FIG. 21, an additional optical connector 220 must be employed to connect the optical fibers 200 in the flat wire to optical fibers 230 from an external source as shown in FIG. 22.

In FIG. 22, a wire 10, containing conductors 11 and at least one optical fiber 200, is fed to a flat wire connector 90, 100 of the present invention, where the layers of each conductor 11 are connected to the connector 90, 100 as described immediately above. The optical fibers 200, however, must be routed past the connectors 90, 100 for connection to the optical fibers 230 from the external source. Preferably, the optical fibers 200 would be routed past the connectors 90, 100 in a substantially straight manner, that is, with as little bends as possible.

Such straight routing may be achieved in any number of ways. For example, depending on the alignment of the fibers with regard to the connector 90, 100, notched grooves 240, 240' can be provided through the lower surfaces of the connector 90, 100 and the optical connector 220, respectively. Alternately, respective via holes 250, 250' can be provided in the connector 90, 100 and the optical connector 220. In addition, a space can be provided above or below the connector 90, 100 and the optical connector 220. Thereafter, any conventional optical connecter may be utilized to connect the optical fibers 200 in the wire to the optical fibers 230 from the external source in a conventional means as shown in FIG. 22.

Switches

A unique set of switches 124' are provided for use with the wire products of the present invention. The switches may be electrically wired to an existing switch, or plugged into an existing outlet, or operated by radio frequency (RF) remote power. The switches are used mainly with the 3-conductor and 5-conductor wires, and under-surface lighting embodiments described above.

Figure 11C:
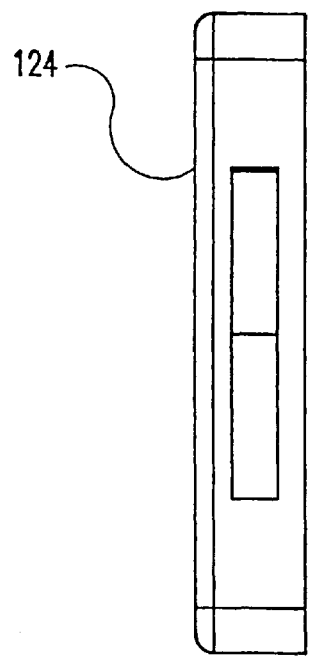
FIGS. 11B and 11C are front and side perspective views, respectively, of a side mounted switch.
Figure 11B:
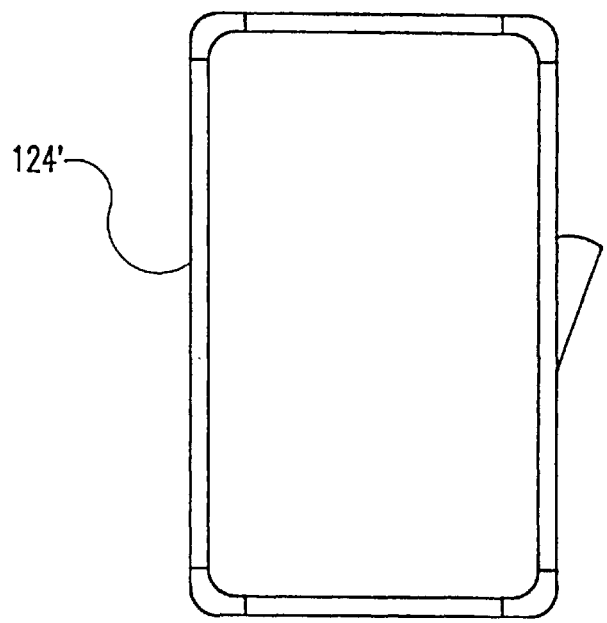

The switch mechanism may be front or side mounted (FIGS. 11B and 11C) and many switch variations are contemplated, including:

(1) toggle controlled, permanent mount, discrete wired;

(2) capacitive touch or membrane switch controlled, permanent mount, discrete wired;

(3) capacitive touch or membrane switch controlled, permanent mount, radio frequency (RF) sender/receiver pair;

(4) capacitive touch or membrane switch controlled, hand held or wall hung, RF sender/receiver pair; or (5) capacitive touch or membrane switch controlled full dimmer set with indicators, band held or wall hung, RF sender/receiver pair.

Regardless of the particular type of switch utilized, however, all of the switches share certain common elements. The switches 124' (see FIG. 12B) do not switch the AC circuit. Rather, they send a signal, via a low voltage wire 125 (12 VDC) as shown in FIG. 12B, to the corresponding plug that will switch the AC circuit.

If the switch unit is hardwired, it is coupled via voltage circuits. This makes the switches incapable of being used without a compatible plug unit.

Tools

The unique thin, flat wires of the present invention require equally unique insulation stripping tools to facilitate attachment to connectors and existing outlets. Each wire embodiment described above will have its own specialized tools.

Two versions are contemplated—one directed to use by professional electricians or installers and the other to non-professionals. The professional stripping tool is designed to cut and strip the insulation layer 17 off the conductors 11 in a single procedure similar to the manner of operating a conventional stripping tool. Considering the small thicknesses of the conductors, it is apparent that the stripping tool be precisely milled to allow for such precision cutting and stripping. Such precise milling may tend to raise the cost of such a tool, making it economically feasible for professional use only.

A second slicing tool directed to the non-professional will align the wire in the stripper and slice adjacent and perpendicular to the conductors, to allow the user to strip away the necessary insulation material to get to the conductive layers. The insulation is then peeled back and removed by scissors.

System Applications

A general illustrative system embodiment—incorporating the various wires, outlets, switches, and connectors described above—is shown in FIG. 12A.

Figure 12A:
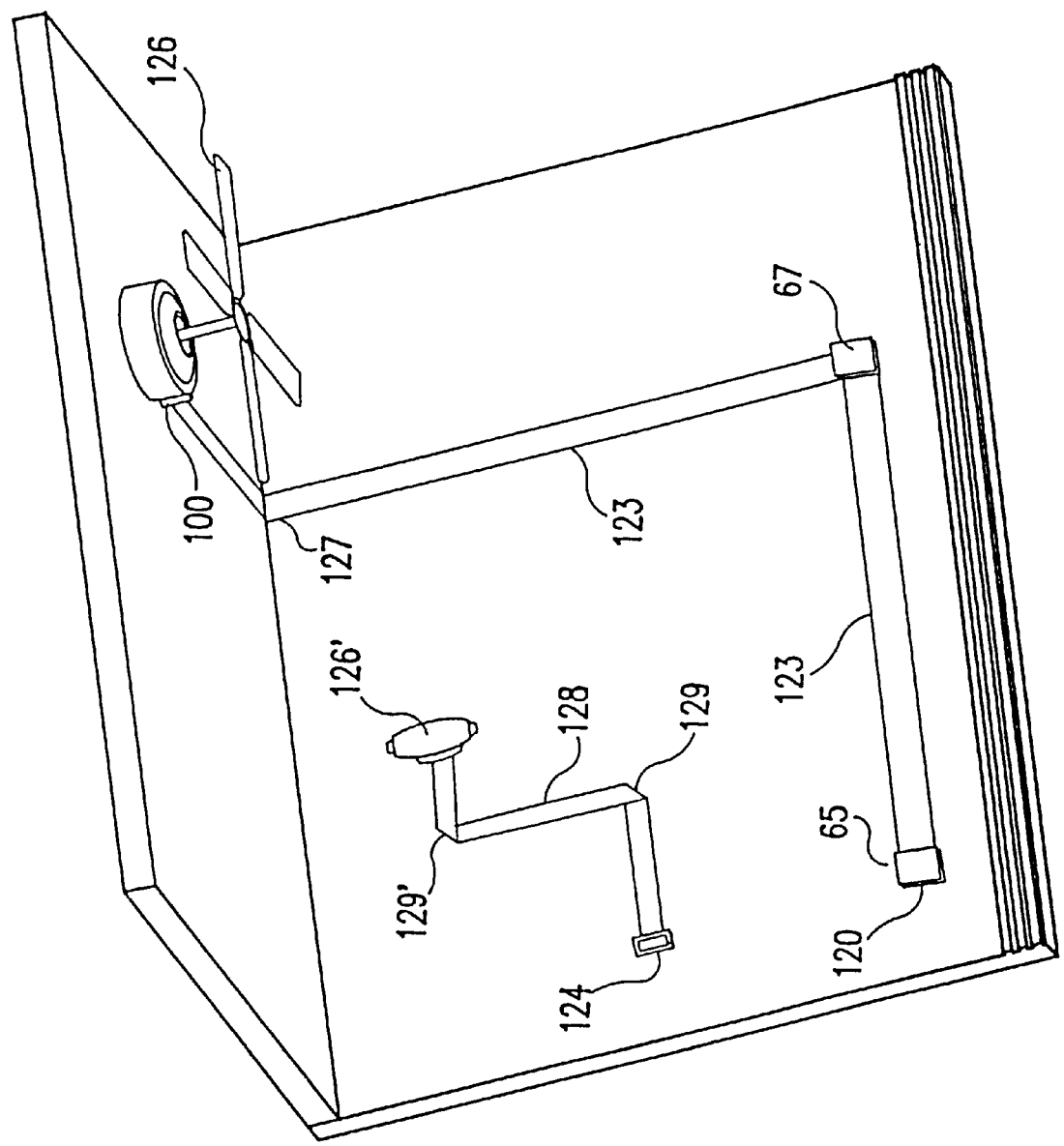
FIG. 12A is a perspective view of the surfaced mounted flat wire connected to a ceiling fan.
Figure 12B:
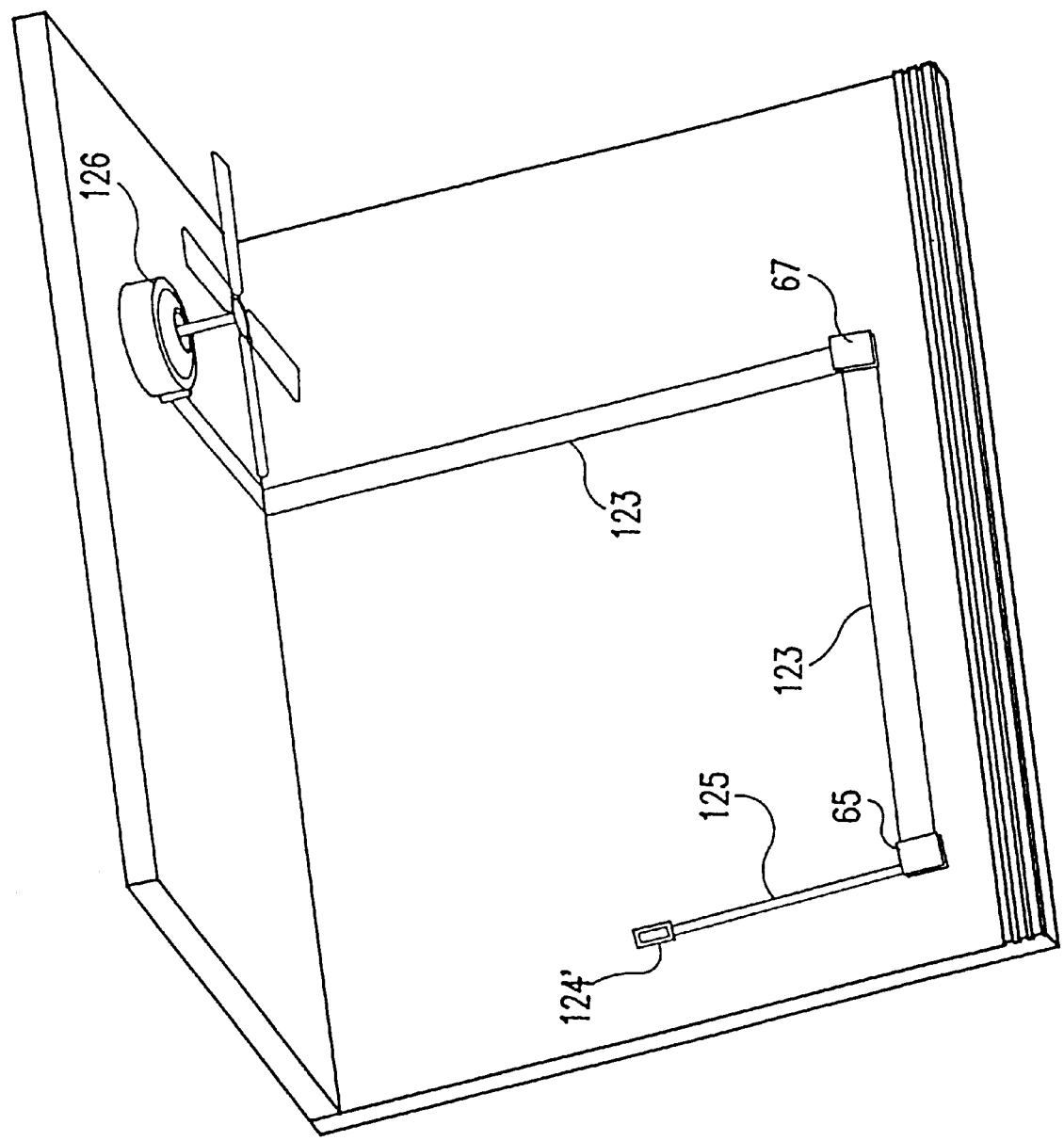
FIG. 12B is a perspective view of the discrete wired switch embodiment in accordance with the present invention.

With reference to FIG. 12A, there is provided a conventional outlet 120 and conventional switch 124. A person desirous of wiring a ceiling fan 126 in the location shown would normally have to engage in an expensive wall and ceiling wiring job to bring electric current to the subject fan.

By utilizing the flat wires, outlets, switches, and connectors of the present invention, however, the task is greatly simplified as is now described. First a pluggable outlet 65 (FIG. 8A) is plugged into the conventional outlet 120. Next, a stand-alone outlet 67 is fastened to the wall in the desired location. Lengths of flat wire 123 (e.g., 3-conductor or 5-conductor 110 VAC) are run between the pluggable outlet 65 and stand-alone outlet 67, and again between stand-alone outlet 67 and the fan.

A connector 90 (not shown in FIG. 12A, but is of the type depicted in FIG. 9A) connects the flat wires 123 to the pluggable and stand-alone outlets 65 and 67. In addition, another connector 100 (of the type depicted in FIG. 10A) connects the conventional round wires of the fan 126 with the flat wire 123.

The flat wire 123 is affixed to the wall surface with the adhesive layer 17 as described above, typically double sided tape, and either painted or papered over to obscure the wire.

As illustrated, the flexible, flat wire 123 incurs a 90 degree bend along its width at point 127 where the ceiling and wall adjoin, as the flat wire is adhered to a different planar surface. In addition to bending at any angle along its width to accommodate different planar surface joints, the flexible wire may actually be bent back upon itself at any angle to accommodate angle changes on the same planar surface.

Consider, for example, the second wall lighting apparatus 126' in FIG. 12A. The wall light 126' is connected to standard switch 124 by a flat wire 128. For aesthetic reasons, rather than put a second stand-alone switch near the conventional switch, the flat wire is bent at a 45 degree angle at points 129 and 129'. The flat wire is basically folded back upon itself to achieve the 45 degree turn.

FIGS. 13–17 are more specific diagrammatic representations of the various system embodiment using the flat wires previously disclosed. The systems are briefly described below.

Figure 13:
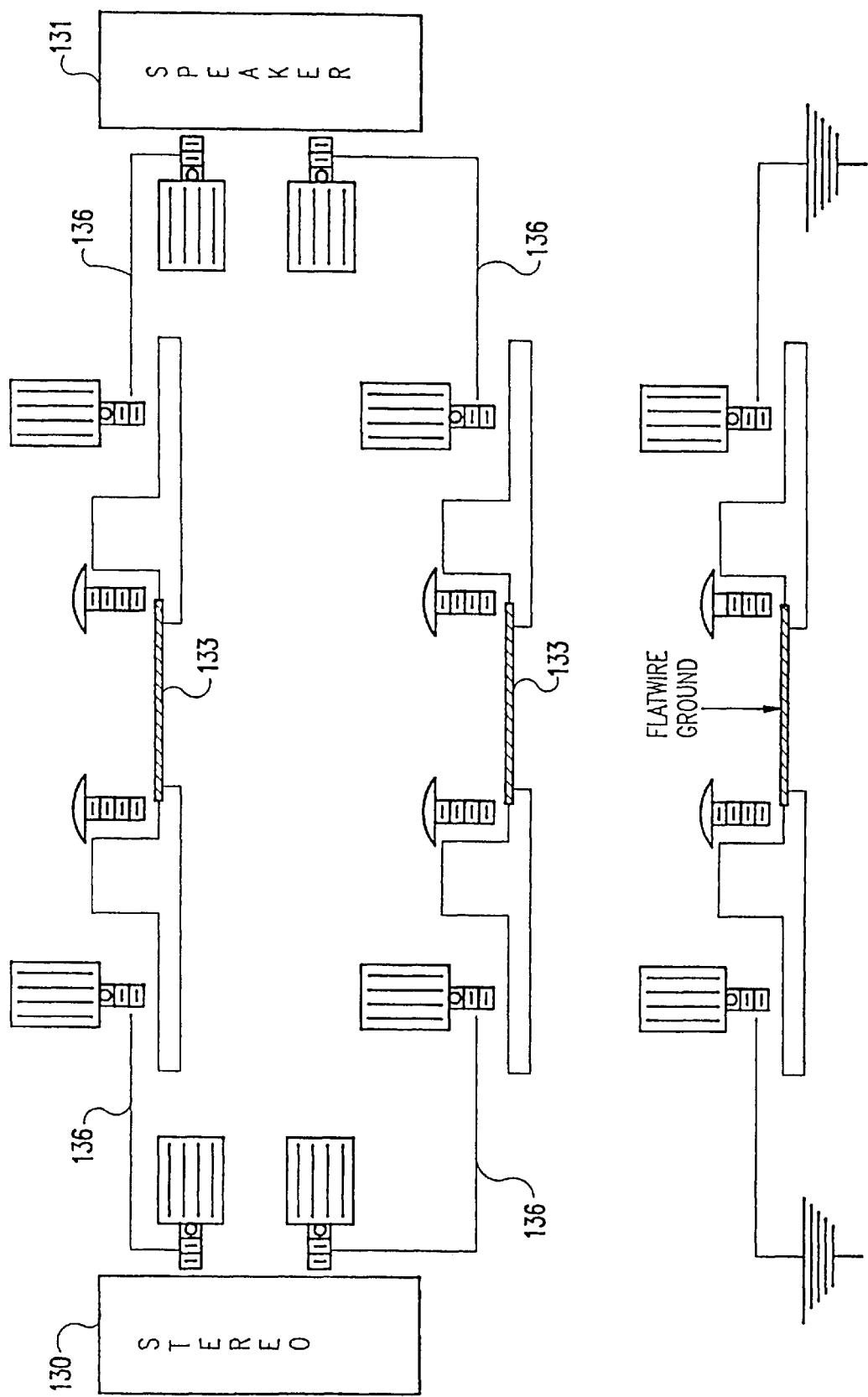
FIG. 13 is a diagrammatical representation of a flat wire/loud speaker system configuration.

FIG. 13 illustrates the flat wire/conventional loud speaker wire interface. For simplicity and ease of illustration, only one speaker 131 is illustrated with stereo 130. It is understood that any number of speakers may be used with the flat wires of the present invention.

As illustrated, stereo system 130 is connected to speaker 131 via flat wires 133. The speaker 131 can be placed in any desired location. The traditional speaker wires 136 are then connected to a stand-alone plug on the wall. A second stand-alone plug is placed in the desired location near the new speaker position. The flat wires 133 are then run between the two stand-alone plugs. The entire length of the flat wire 133 may then be painted or papered over, thereby eliminating unsightly and cumbersome speaker wire.

Figure 14:
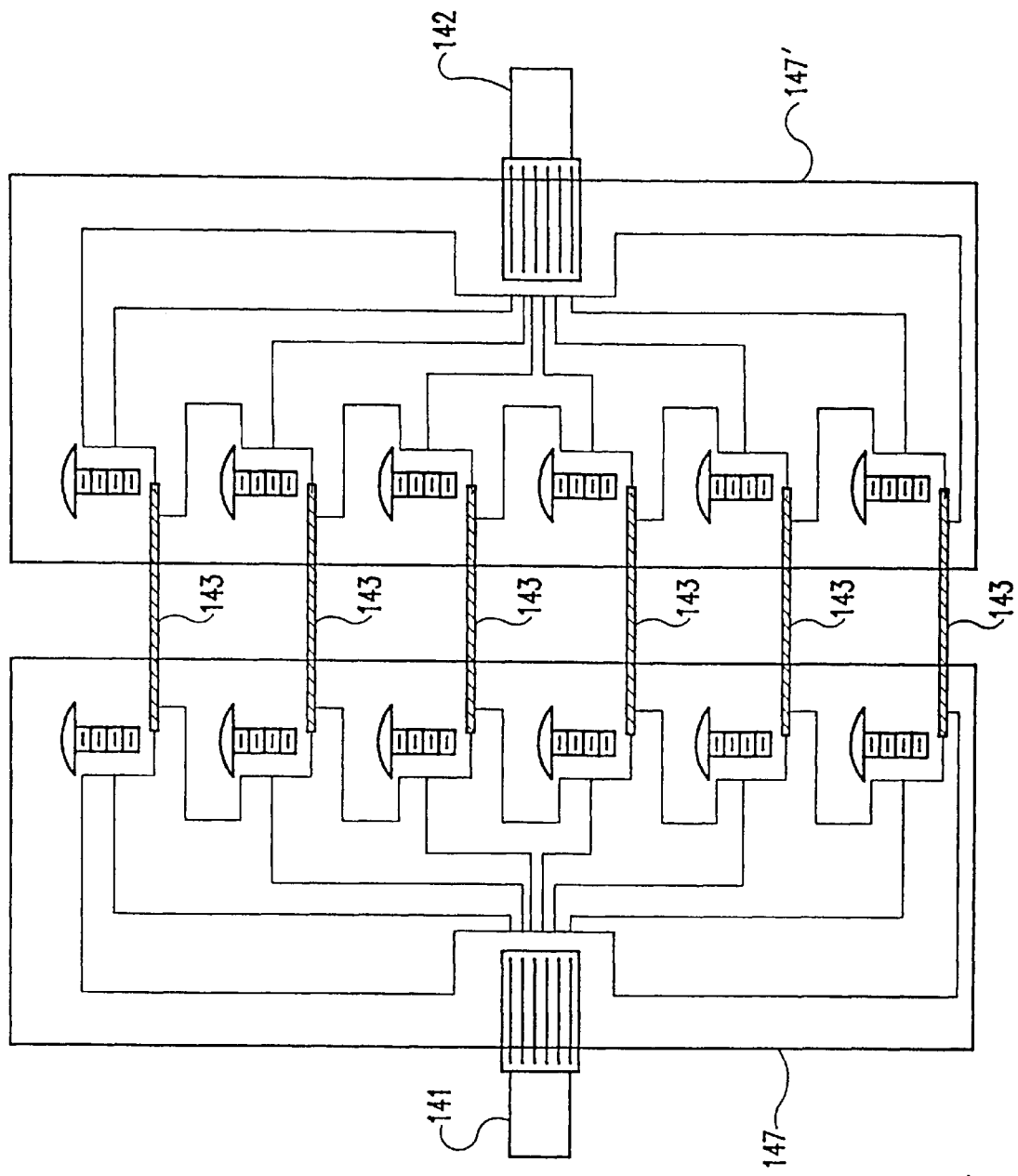
FIG. 14 is a diagrammatical representation of a flat wire/phone jack system configuration.

With reference to FIG. 14, there is shown a diagrammatic representation of the application of the flat wire/conventional phone jack interface for use in providing a connection to an extension phone.

As illustrated, the existing phone jack or phone receptacle 141 is connected to the extension phone jack 142 via flat wires 143. As shown, a flat wire phone apparatus 147 is connected to the existing phone jack 141. The extension phone jack 142 is then placed in the desired location and connected to flat wire phone apparatus 147'. The flat wires 143 are then connected between the flat wire phone apparatuses 147 and 147'. The entire length of the flat wire 143 may then be painted or papered over, thereby eliminating unsightly and cumbersome phone wire.

Figure 15:
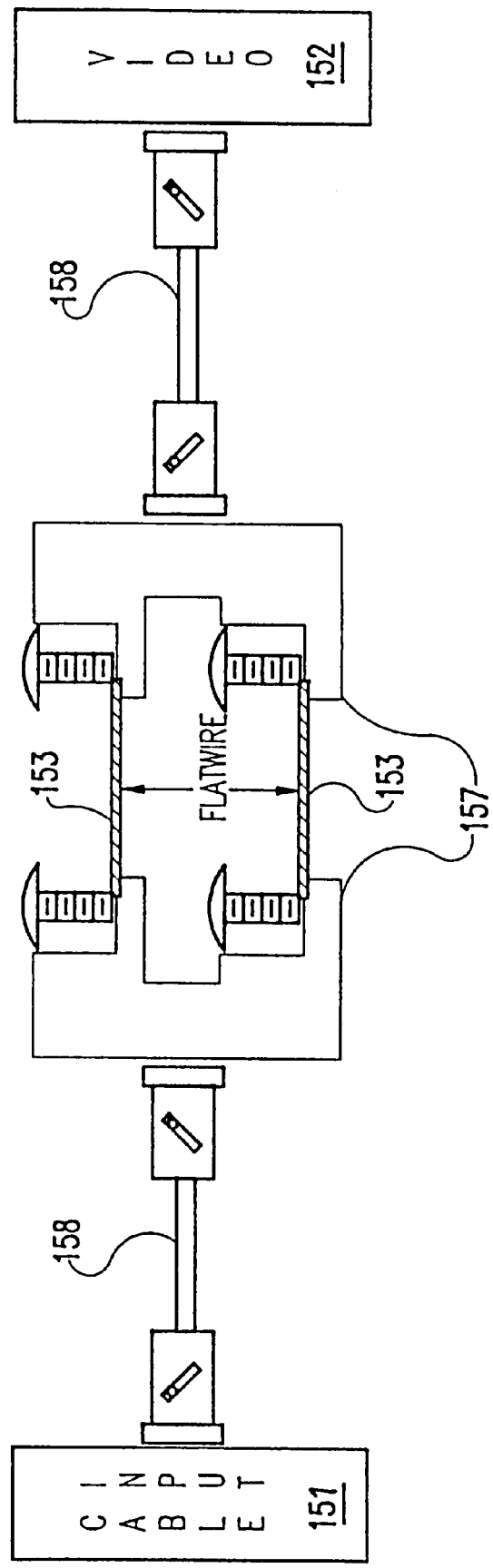
FIG. 15 is a diagrammatical representation of a flat wire/CATV system configuration.

A diagrammatic representation of a CATV application is shown in FIG. 15. The cable input 151 is fed into the house via the 75 ohm coaxial cable 158. The cable 158 is then connected to 75 ohm–300 ohm conversion apparatus 157 located on the wall near the input 151 into the house. A second conversion apparatus 157 is placed near the desired television 152 location. Flat wires 153 are then run between the two conversion apparatuses. As above, the entire length of the flat wire 153 may then be painted or papered over, thereby eliminating unsightly and cumbersome CATV wire.

Figure 16:
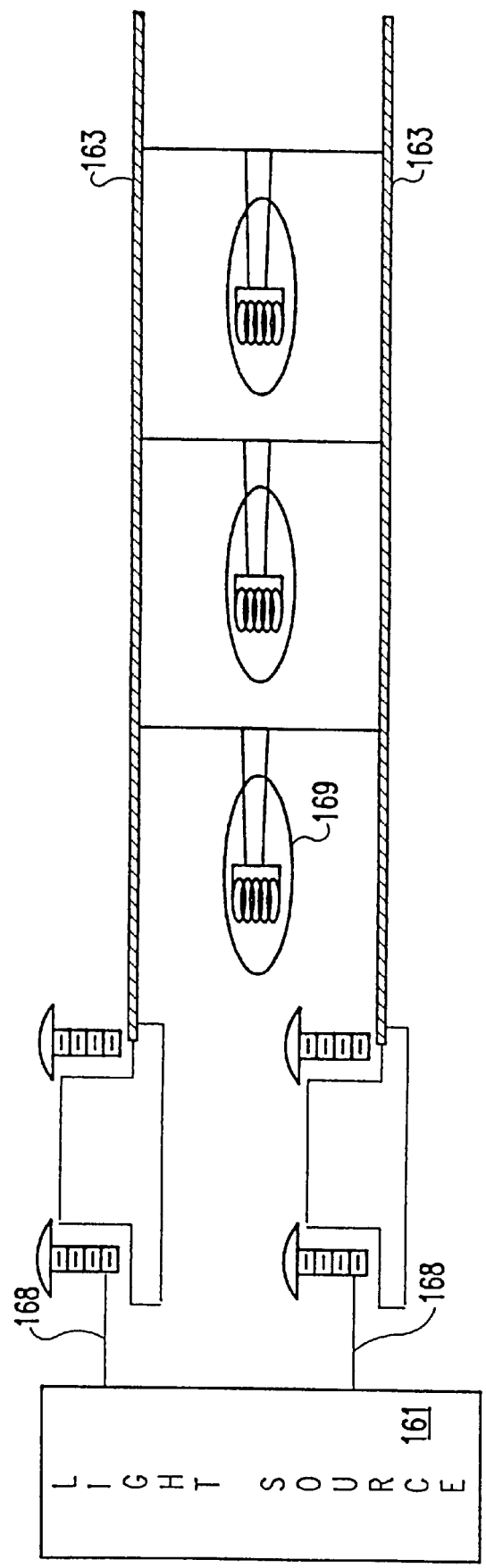
FIG. 16 is a diagrammatical representation of a flat wire/embedded light system configuration.

The under surface lighting embodiment, including flat wires 163 with embedded lights 169, is shown in FIG. 16. The switch or plug 161 is connected to the flat wire 163. The embedded lights 169, may be, for example, double-ended RSC base 120V halogen lamp from 20 to 100 watts. The flat wires can be placed in any under surface location where additional light is desired, such as under a cabinet or shelf. The flat wire 163 may then be painted or papered over to match the rest of the surface.

Figure 17:
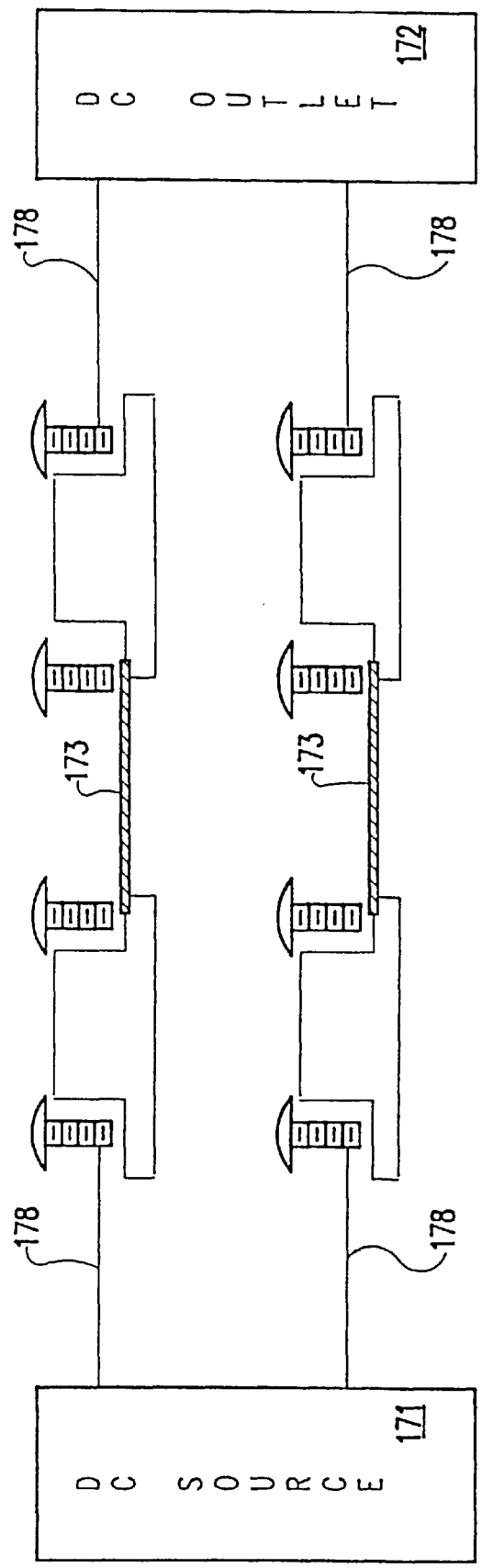
FIG. 17 is a diagramnatical representation of a flat wire/DC power system configuration.

The flat wires of the present invention may also be used with direct current (DC) applications. With reference to FIG. 17, a DC source 171 is connected to a DC outlet 172, via flat wires 173. As in the other system embodiments, wall connectors provide the interface between the conventional DC wires 178 and flat wires 173.

Ground Fault Interruption (GFI) Circuit

Since the flat wire is nearly invisible after it is painted or papered over, there is a possibility that at some later date, a person could inadvertently drive a nail or picture hook through the flat wire, or otherwise cut the wire.

In each of the systems, therefore, a ground fault interruption (GFI) module(s) 77 (see FIGS. 8A–8C) will be provided as a safety measure to prevent injury should accidental penetration through the ultra thin layers of insulation occur. The term ground fault comes from anything or any person providing a ground path other than the normal internal ground.

The GFI circuit will monitor the current flow through the power and neutral conductors of the AC circuits, and if more than ten milliampere of mismatch is sensed, then both conductors will be disconnected by a circuit breaker. The circuit breaker will be fast enough to prevent any permanently harmful discharge.

The circuits will provide a fail safe methodology such that any circuits will be checked before connection and rechecked after connection. Power from the circuit will provide connection so that a circuit failure will result in no power beyond the circuit breaker.

As described previously, the circuit is physically located in the "pluggable" outlet 65 (see FIGS. 8A–8C) that plugs into a conventional wall outlet as discussed above. The GFI detection circuit is basically a relay that is normally closed. When the fault current to ground exceeds some predetermined value that is less than that required to operate the overcurrent protective device of the supply circuit, the relay opens, interrupting the electric current to the load.

Figure 18:
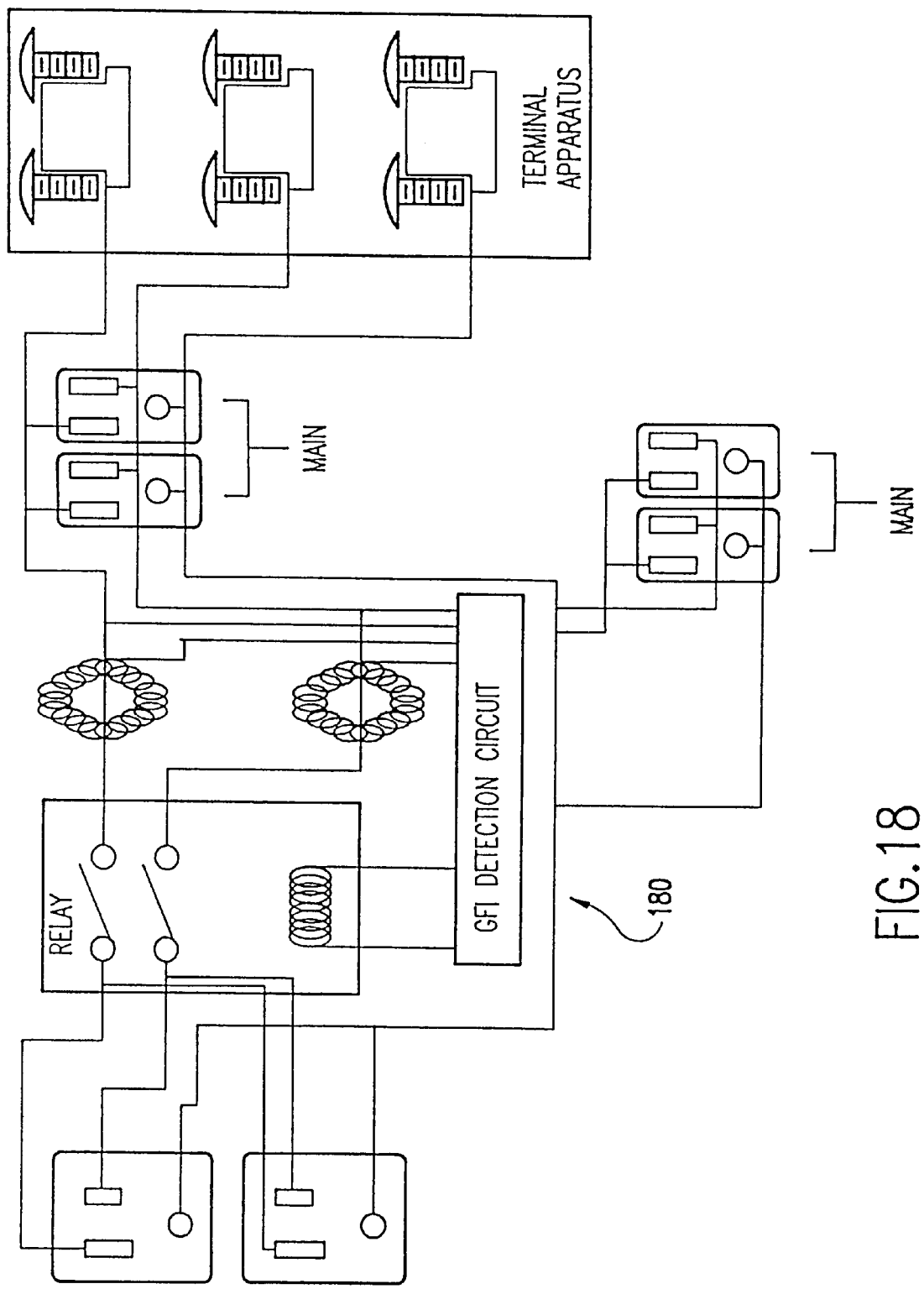
FIG. 18 is a diagrammatical representation of a GFI detection circuit for 4 outlets and 3 terminals without a switchable input plug.

FIG. 18 illustrates a standard single circuit 180 non-switchable two-plug system having a GFI detection circuit connected to a 4-plug, 3-terminal apparatus in accordance with the present invention.

Figure 19:
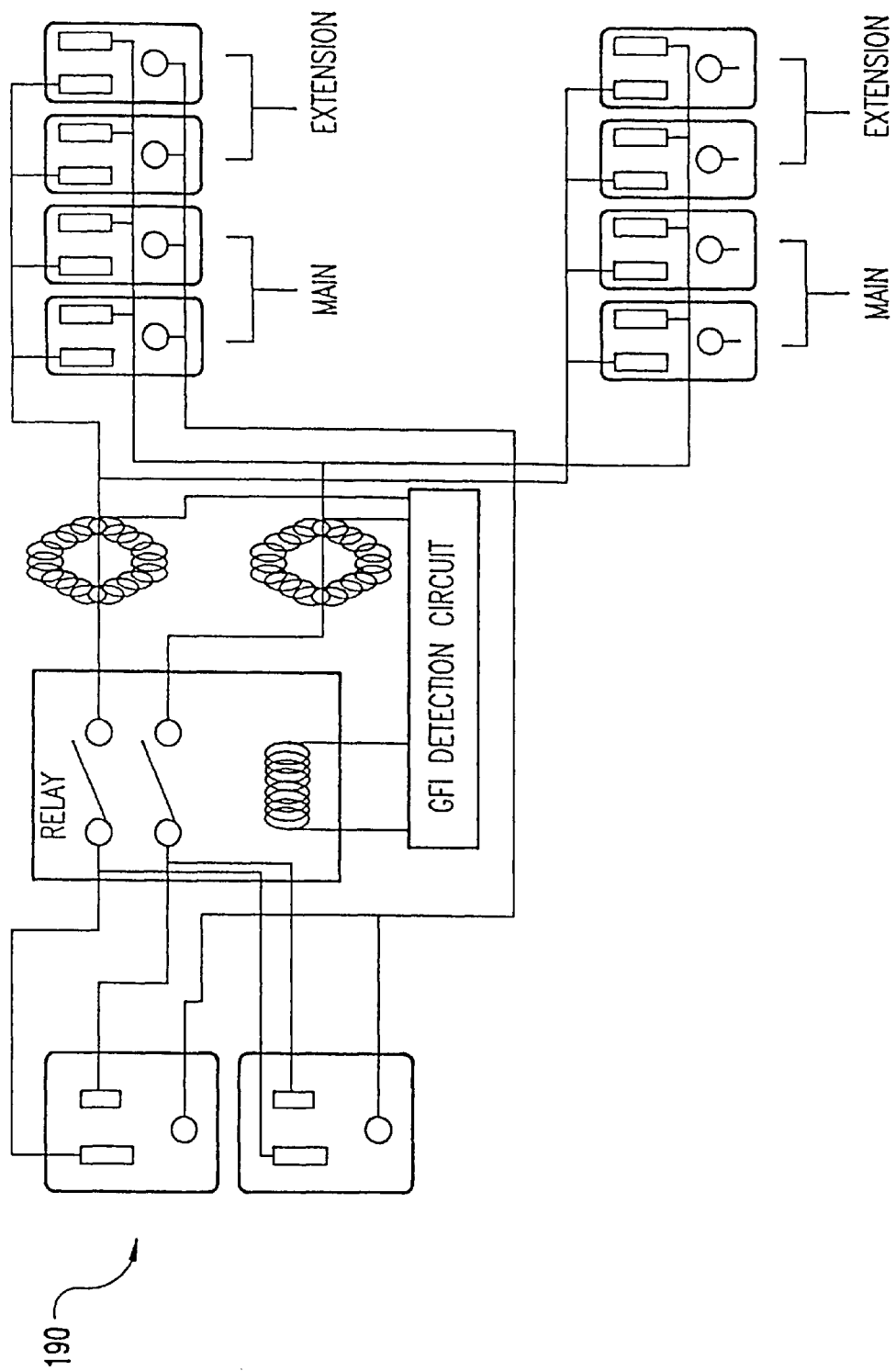
FIG. 19 is a diagrammatical representation of a GFI detection circuit for 8 outlets without a switchable input plug.

FIG. 19 illustrates a standard single circuit 190 non-switchable two-plug system having a GFI detection circuit connected to an 8-plug apparatus (4 main plugs and 4 extension plugs) in accordance with the present invention.

Figure 20:
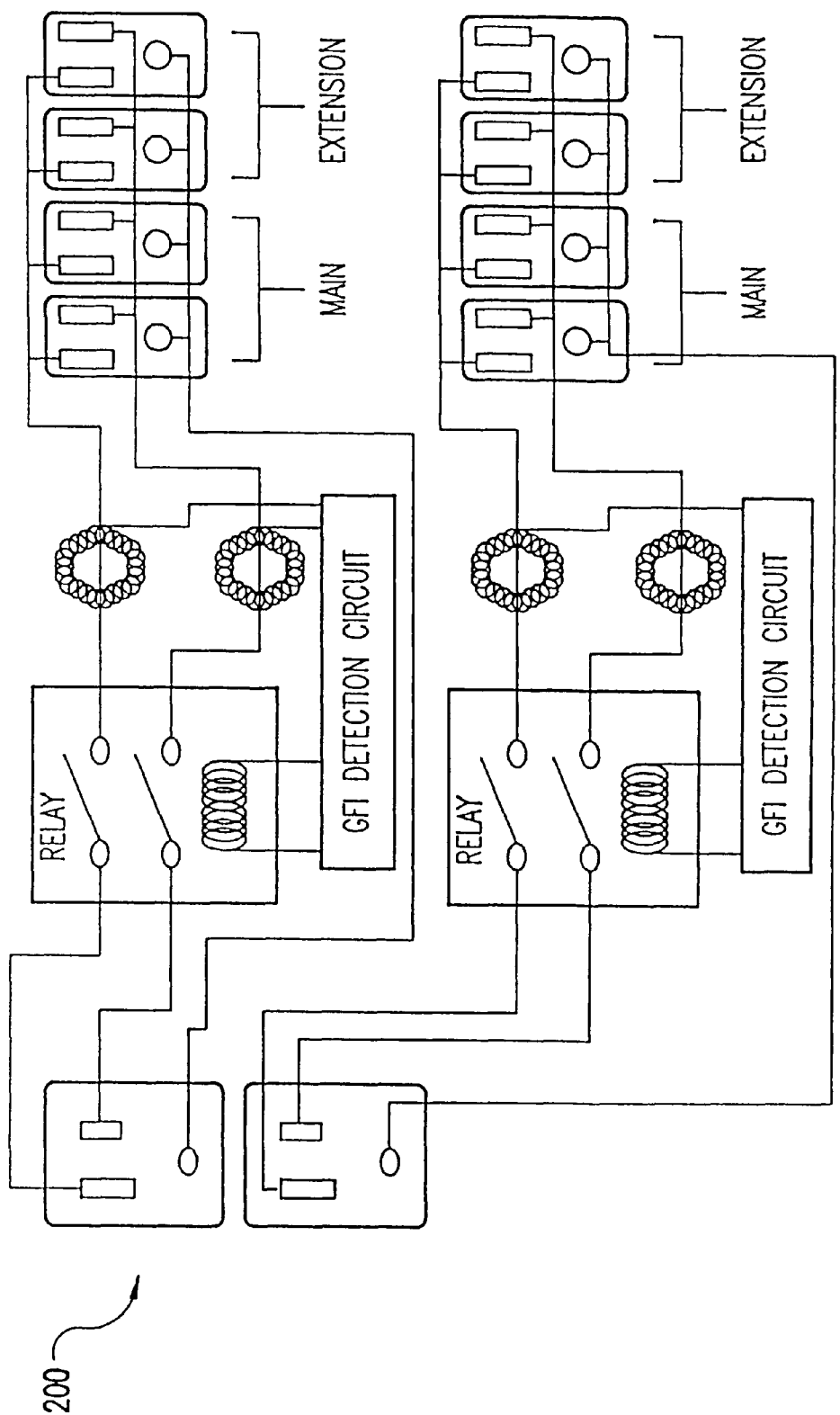
FIG. 20 is a diagrammatical representation of a GFI detection circuit for 8 outlets with a switchable input plug.

FIG. 20 illustrates a standard two circuit 200 switchable two-plug system, therefore requiring two GFI detection circuits, each connected a 4-plug apparatus (2 main plugs and 2 extension plugs) in accordance with the present invention.

While the invention has been described in terms of the embodiments described above, those skilled in the art will recognize that the invention can be practiced with modification within the spirit and scope of the appended claims.

Having thus described my invention, what I claim as new and desire to secure by letters patent is as follows:

1. A surface mounted, flexible, loud speaker wire, comprising:
    a plurality of flat elongated conductors spaced about 0.2–0.3 inches apart in a generally parallel relationship, wherein each of said flat conductors comprises three aluminum layers, each of said aluminum layers being about 0.002 inches thick and about 0.8–1.1 inches wide;
    an adhesive material separating said plurality of flat conductors; and
    an insulation layer surrounding said plurality of flat conductors and said adhesive material, said adhesive material bonding to the insulation layer,
    wherein a cross-sectional height of said flat conductors and insulation layer is about 0.008 inches, such that the loud speaker wire will blend in with a surface when painted or after wallpaper is applied, and wherein said loud speaker wire is equivalent to 10 gauge stranded wire.

2. A surface mounted, flexible, telephone wire, comprising:
    a plurality of flat elongated conductors spaced about 0.125–0.25 inches apart in a generally parallel relationship, wherein each of said flat conductors comprises three aluminum layers, each of said aluminum layers being about 0.002 inches thick and about 0.25–0.5 inches wide;
    an adhesive material separating said plurality of flat conductors; and
    an insulation layer surrounding said plurality of flat conductors and said adhesive material, said adhesive material bonding to the insulation layer,
    wherein a cross-sectional height of said flat conductors and insulation layer is about 0.008 inches, such that the telephone wire will blend in with a surface when painted or after wallpaper is applied, and wherein said telephone wire is equivalent to 22 gauge telephone wire.

3. A surface mounted, flexible, cable television wire, comprising:
    a plurality of flat elongated conductors spaced about 0.4–0.6 inches apart in a generally parallel relationship, wherein each of said flat conductors comprises three aluminum layers, each of said aluminum layers being about 0.002 inches thick and about 0.5–0.8 inches wide;
    an adhesive material separating said plurality of flat conductors; and
    an insulation layer surrounding said plurality of flat conductors and said adhesive material, said adhesive material bonding to the insulation layer,
    wherein a cross-sectional height of said flat conductors and insulation layer is about 0.008 inches, such that the cable television wire will blend in with a surface when painted or after wallpaper is applied, and wherein said cable television wire is rated at 300 ohms.

4. A surface mounted, flexible, low voltage wire, comprising:
    a plurality of flat elongated conductors spaced about 0.2–0.3 inches apart in a generally parallel relationship, wherein each of said flat conductors comprises three aluminum layers, each of said aluminum layers being about 0.002 inches thick and about 0.4–0.65 inches wide;
    an adhesive material separating said plurality of flat conductors; and
    an insulation layer surrounding said plurality of flat conductors and said adhesive material, said adhesive material bonding to the insulation layer,
    wherein a cross-sectional height of said flat conductors and insulation layer is about 0.008 inches, such that the low voltage wire will blend in with a surface when painted or after wallpaper is applied.

5. A surface mounted, flexible, multi-purpose wire, comprising:
    a plurality of flat elongated conductors lying in a same plane and spaced apart in a generally parallel relationship, wherein each of said plurality of flat conductors comprises a plurality of conductive layers, and wherein said flat conductors have high and low voltage and current carrying capacity;
    at least one optical fiber lying lengthwise in said plane between two of said plurality of flat conductors;
    an insulation layer surrounding said plurality of flat conductors and said at least one optical fiber;
    an adhesive material disposed between said plurality of flat conductors and bonding to said insulation layer, wherein said adhesive material does not contact said at least one optical fiber; and
    an adhesive layer affixed to said insulation layer for bonding said wire to a flat surface,
    wherein a cross-sectional height of said flat conductors and insulation layer is less than about 0.040 inches such that the multi-purpose wire will be consistent with said surface when painted or after wallpaper is applied.

6. The wire as in claim 5, wherein said at least one optical fiber is disposed in close proximity to the flat conductors and has a diameter less than the cross-sectional height of said flat conductors.

7. The wire as in claim 6, wherein each of said plurality of conductive layers is about 0.004 to about 0.020 inches thick.

8. The wire as in claim 7, wherein said insulation layer is selected from the group consisting of polyester films, urethane films, and heat-resistant/scratch resistant films.

9. The wire as in claim 8, wherein said adhesive material is at least one of adhesive tape and liquid adhesive.

10. The wire as in claim 9, wherein said current carrying capacity is in a range of approximately several milliamps to approximately 20 amps.

11. The wire as in claim 10, wherein said conductive layers are copper.

12. The wire as in claim 10, wherein said conductive layers are aluminum.

13. An optical cable, comprising:
    a plurality of flat elongated metal support members lying in a same plane and spaced apart in a generally parallel relationship;
    at least one optical fiber lying lengthwise in said plane between two of said metal support members;
    an insulation layer surrounding said metal support members and said at least one optical fiber;
    an adhesive material disposed between said metal support members and bonding to said insulation layer wherein said adhesive material does not contact said at least one optical fiber; and
    an adhesive layer affixed to said insulation layer for bonding said optical cable to a flat surface,
    wherein a cross-sectional height of said metal support members and insulation layer is such that the optical cable will be consistent with a flat surface when painted or after wallpaper is applied.

14. The cable as in claim 13, wherein each of said metal support members comprises a plurality of metallic layers.

15. The cable as in claim 14, wherein a cross-sectional height of said metal support members and insulation layer is less than about 0.040 inches.

16. A surface mounted, flexible, multi-purpose wire, comprising:
    three flat elongated conductors spaced about 0.2–0.3 inches apart in a generally parallel relationship, wherein each of said flat conductors comprises three aluminum layers, each of said aluminum layers being about 0.002 inches thick and about 0.5–0.8 inches wide; and
    an insulation layer surrounding said plurality of flat conductors,
    wherein the cross-sectional height of said flat conductors and insulation layer is about 0.007 to 0.010 inches, such that the multi-purpose wire will blend in with a surface when painted or after wallpaper is applied, and wherein said multi-purpose wire has a 15 amp, 110VAC rated capacity.

17. A surface mounted, flexible, multi-purpose wire, comprising:
    five flat elongated conductors spaced about 0.2–0.3 inches apart in a generally parallel relationship, wherein each of said flat conductors comprises three aluminum layers, each of said aluminum layers being about 0.002 inches thick and about 0.5–0.8 inches wide, and
    an insulation layer surrounding said plurality of flat conductors,
    wherein the cross-sectional height of said flat conductors and insulation layer is about 0.007 to 0.010 inches, such that the multi-purpose wire will blend in with a surface when painted or after wallpaper is applied, and wherein said multi-purpose wire has a 15 amp, 110VAC rated capacity.

18. A surface mounted, flexible, multi-purpose wire, comprising:
    three flat elongated conductors spaced about 0.4–0.6 inches apart in a generally parallel relationship, wherein each of said flat conductors comprises four aluminum layers, each of said aluminum layers being about 0.002 inches thick and about 0.25–0.8 inches wide, and
    an insulation layer surrounding said plurality of flat conductors,
    wherein the cross-sectional height of said flat conductors and insulation layer is about 0.012 inches, such that the multi-purpose wire will blend in with a surface when painted or after wallpaper is applied, and wherein said multi-purpose wire has a 15 amp, 220VAC rated capacity.

* * * * *